US007251791B2

(12) United States Patent
Wang

(10) Patent No.: US 7,251,791 B2
(45) Date of Patent: Jul. 31, 2007

(54) METHODS TO GENERATE STATE SPACE MODELS BY CLOSED FORMS AND TRANSFER FUNCTIONS BY RECURSIVE ALGORITHMS FOR RLC INTERCONNECT AND TRANSMISSION LINE AND THEIR MODEL REDUCTION AND SIMULATIONS

(76) Inventor: Sheng-Guo Wang, 2516 Radrick La., Charlotte, NC (US) 28262-4443

( * ) Notice: Subject to any disclaimer, the term of this patent is extended or adjusted under 35 U.S.C. 154(b) by 274 days.

(21) Appl. No.: 11/037,636

(22) Filed: Jan. 18, 2005

(65) Prior Publication Data

US 2005/0160387 A1 Jul. 21, 2005

Related U.S. Application Data

(60) Provisional application No. 60/537,351, filed on Jan. 20, 2004.

(51) Int. Cl.
*G06F 17/50* (2006.01)
(52) U.S. Cl. .............................................. 716/1; 716/6
(58) Field of Classification Search .................. 716/1, 716/6; 703/14
See application file for complete search history.

(56) References Cited

U.S. PATENT DOCUMENTS

| 5,841,817 | A * | 11/1998 | Krieger et al. ............... 375/340 |
| 6,460,165 | B1 * | 10/2002 | Ismail et al. .................... 716/1 |
| 7,124,388 | B2 * | 10/2006 | Wang ........................... 716/10 |
| 2005/0021319 | A1 * | 1/2005 | Li et al. ........................ 703/2 |

OTHER PUBLICATIONS

S.-G. Wang, J. Wang, W. Cai, D. Zhou and X. Zhan, "Modeling of RC interconnect Circuit and Its Recursive Algorithm", Proceedings of the IEEE 2002 International Conference on Control and Automation (ICCA 02), pp. 1426-1430, Xiaman, China, Jun. 16-19, 2002.*
M. Reed and R. Rohrer, Applied Introductory Circuit Analysis for Electrical and Computer Engineering, Prentice Hall, Upper Saddlle River, NJ, 1999.*
Yu et al., "Explicit Formulas and Efficient Alogirithm for Moment Computation of Coupled RC Trees With Lumped and Distributed Elements," IEEE, 2001, pp. 445-450.*
Bobba et al., "Maximum Voltage Variation in the Power Distribution Network of VLSI Circuits With RLC Models," IEEE, 2001, pp. 376-381.*

* cited by examiner

*Primary Examiner*—Vuthe Siek

(57) ABSTRACT

There is provided a set of methods with the exact accuracy to effectively calculate the 2n-th order state space models of RLC distributed interconnect and transmission line in closed forms in time domain and transfer functions by recursive algorithms in frequency domain, where their RLC components can be evenly distributed or variously valued. The main features include simplicity and accuracy of the said closed forms of the state space models {A,B,C,D} without involving matrix inverse and matrix multiplication operations, effectiveness and accuracy of the said recursive algorithms of the transfer functions, dramatic reduction of the calculation complexity to $O(n^2)$ for the state space models, simulation methodology, and practice of various model reductions and their optimization. For evenly distributed RLC interconnect and transmission line, the said closed form of state space model has its computation complexity of only a fixed constant, i.e., $O(1)$.

30 Claims, 8 Drawing Sheets

An RLC interconnect and transmission line model (Model 2)

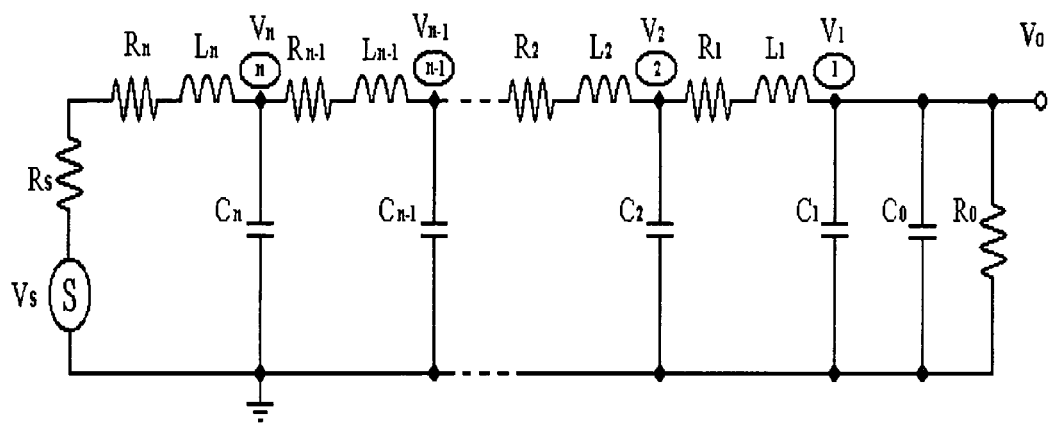
Fig. 1. An RLC interconnect and transmission line model with source and load (Model 1)
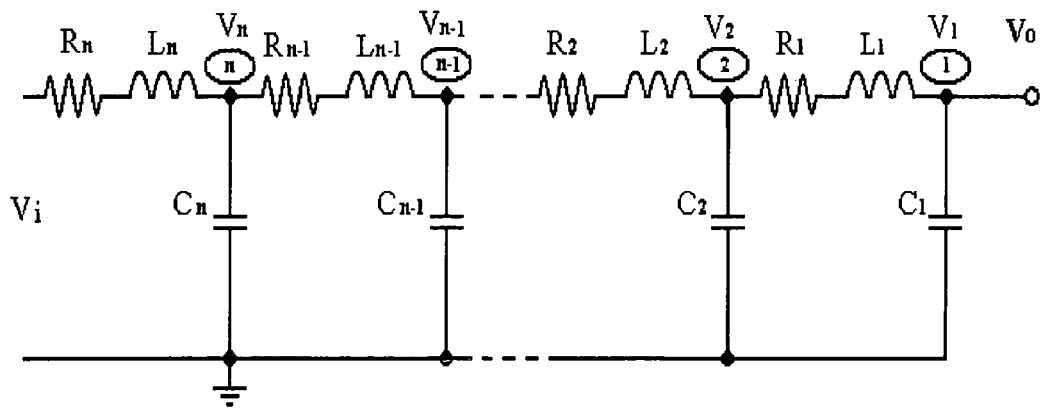
Fig. 2 An RLC interconnect and transmission line model (Model 2)

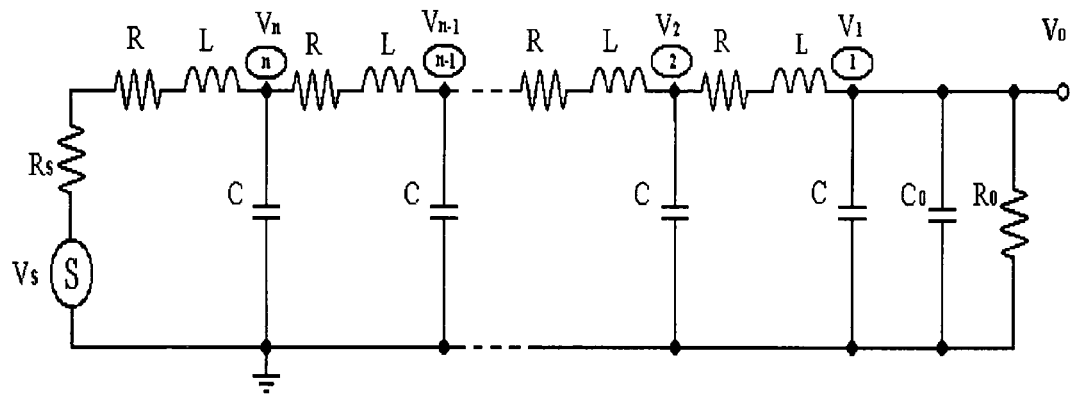
Fig.3 An even RLC interconnect and transmission line model with source and load (Model 3)
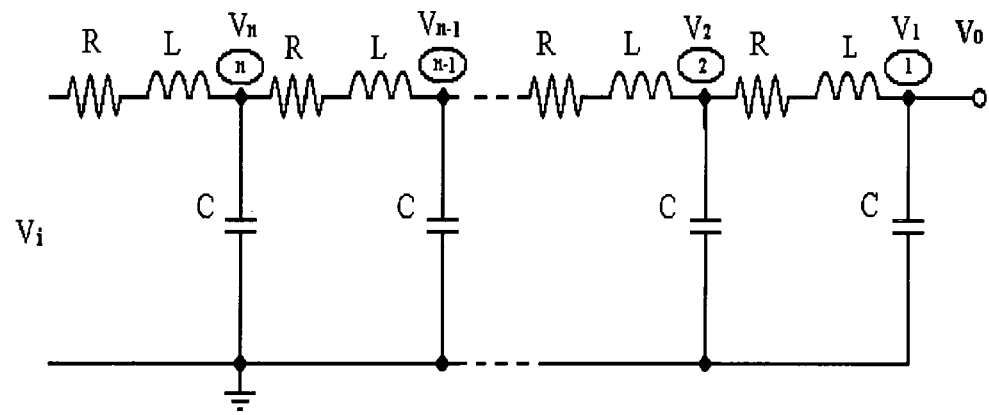
Fig. 4. An even RLC interconnect and transmission line model (Model 4)

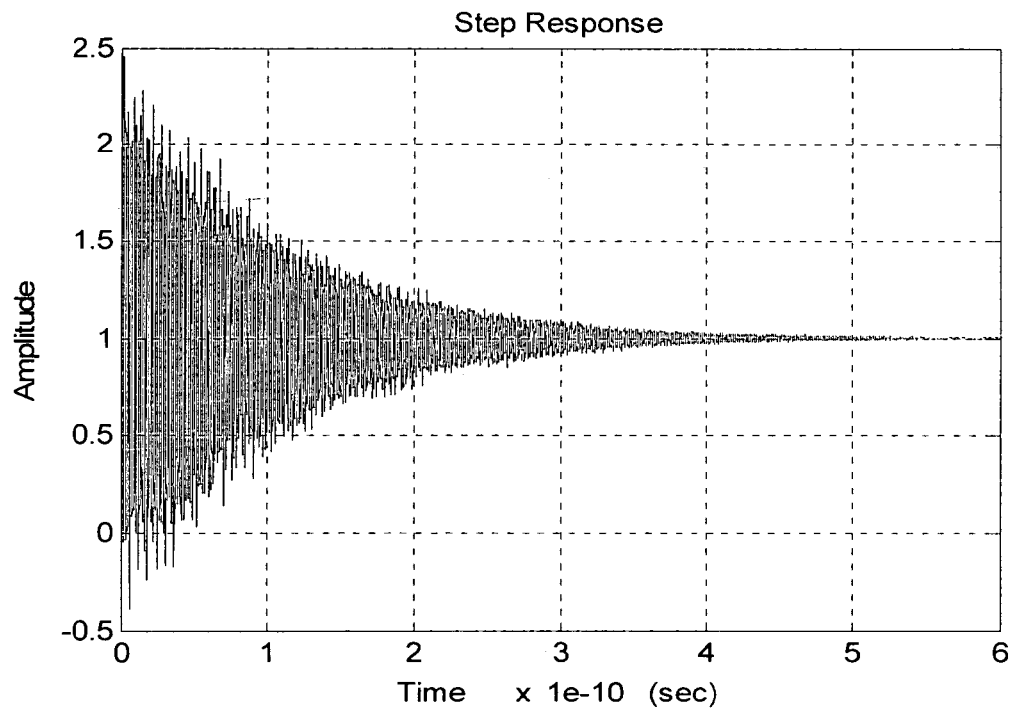
Fig.5. Step Response of an Original Model in Model 4
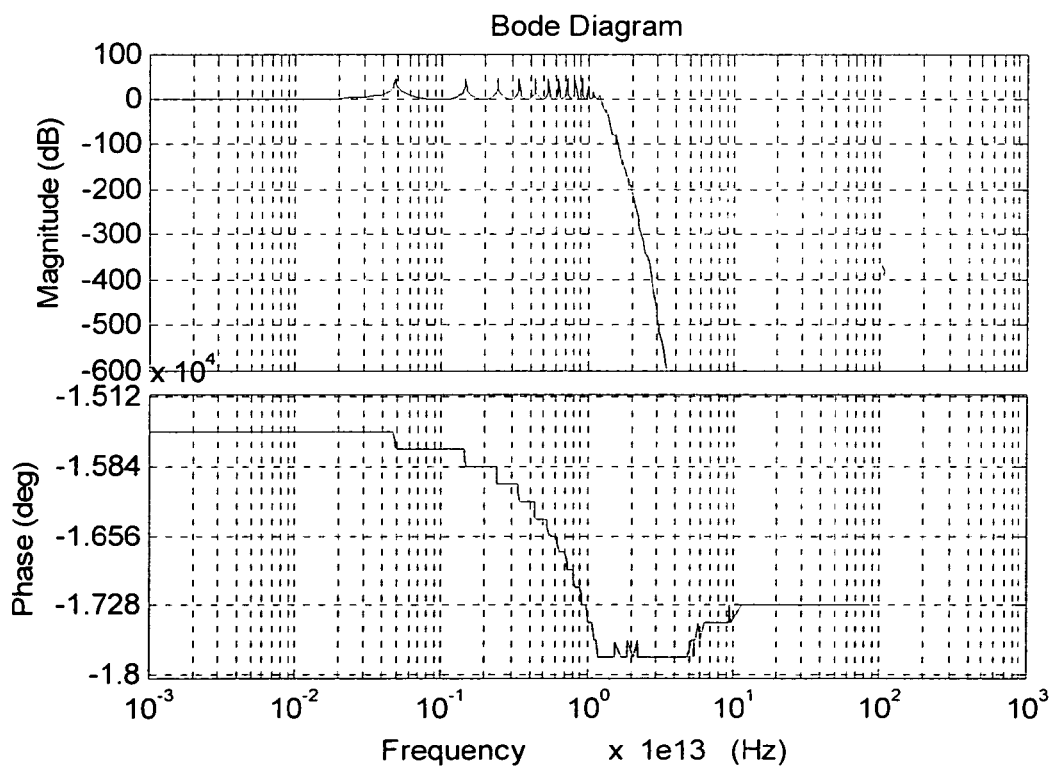
Fig.6. Bode Plot of an Original Model in Model 4

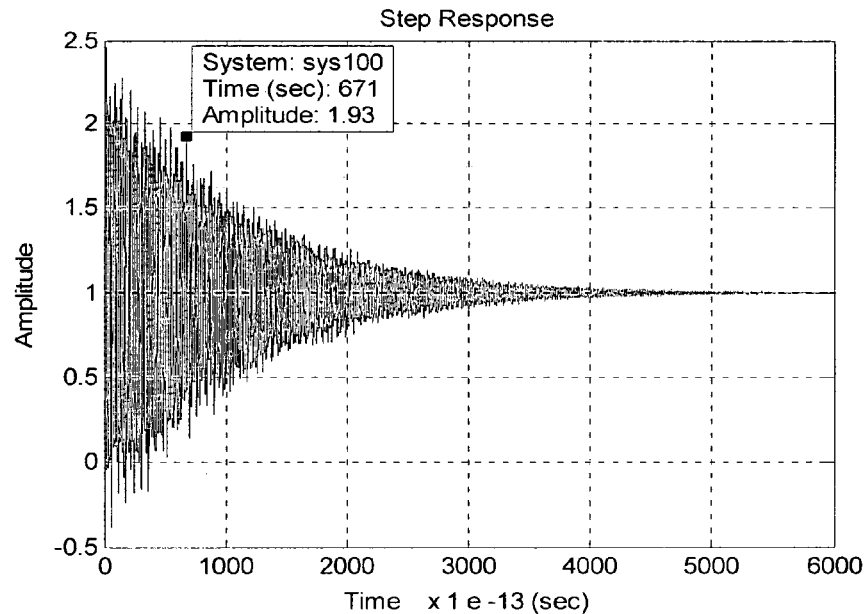
Fig.7. Step Responses of an Original Model and its 2nd Order ELO Model ($n=1$) in Model 4
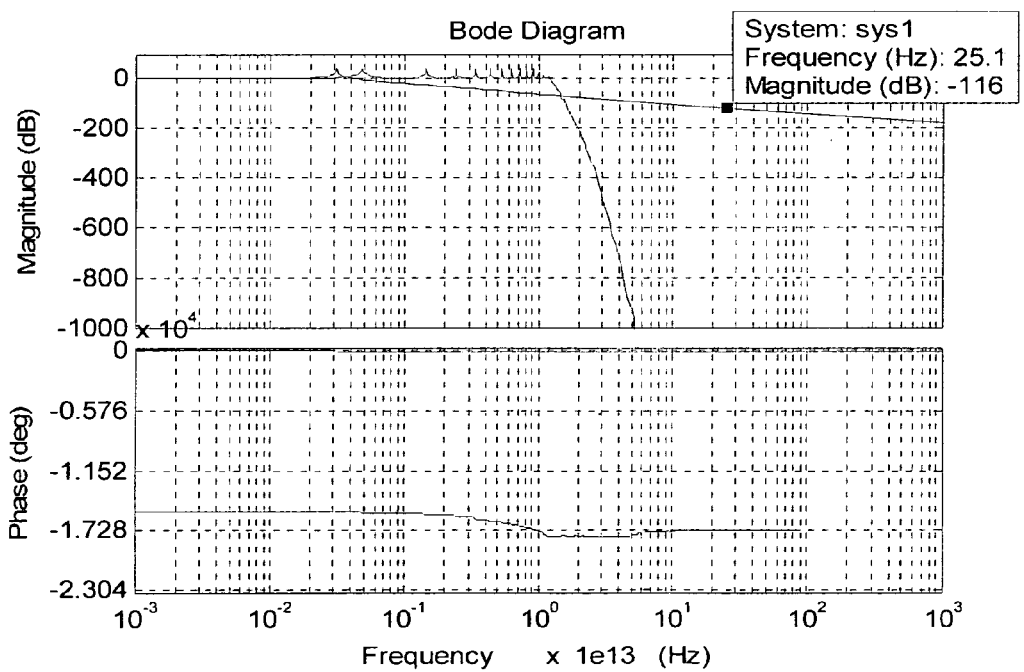
Fig.8. Bode Plots of an Original Model and its 2nd order ELO model ($n=1$) in Model 4

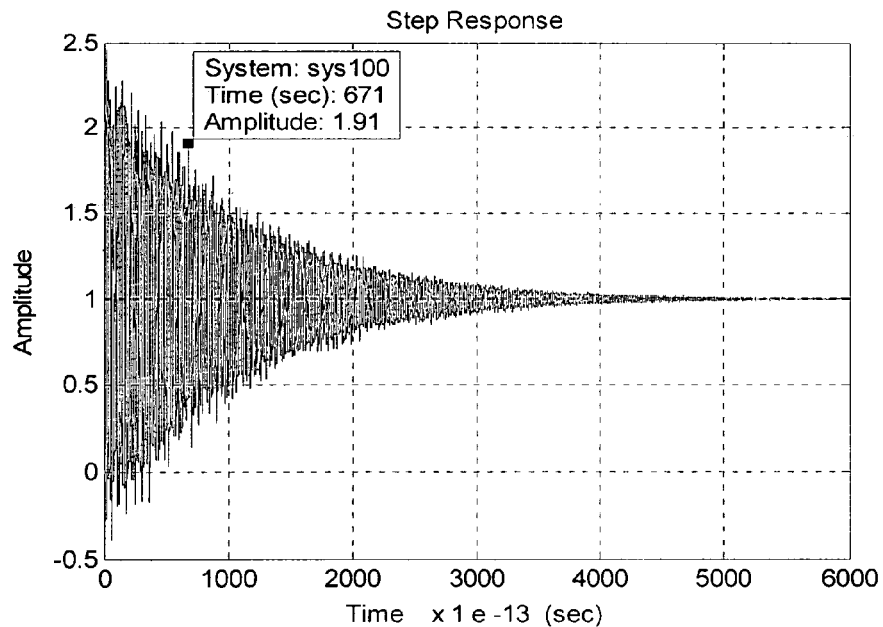
Fig.9. Step Responses of an Original Model and its 4th Order ELO Model ($n = 2$) in Model 4
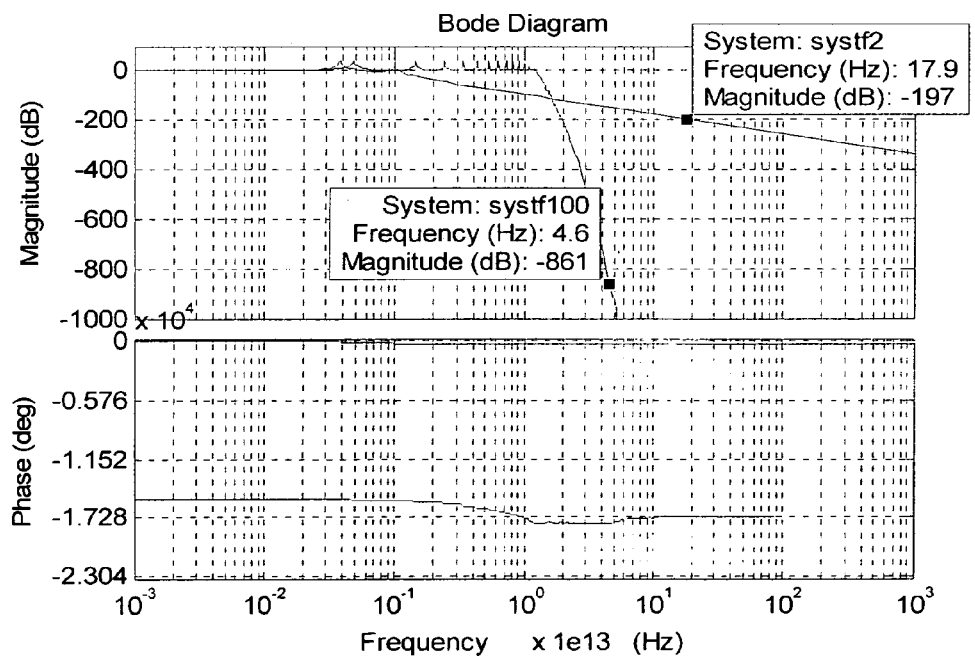
Fig.10. Bode Plots of an Original Model and its 4th Order ELO Model ($n = 2$) in Model 4

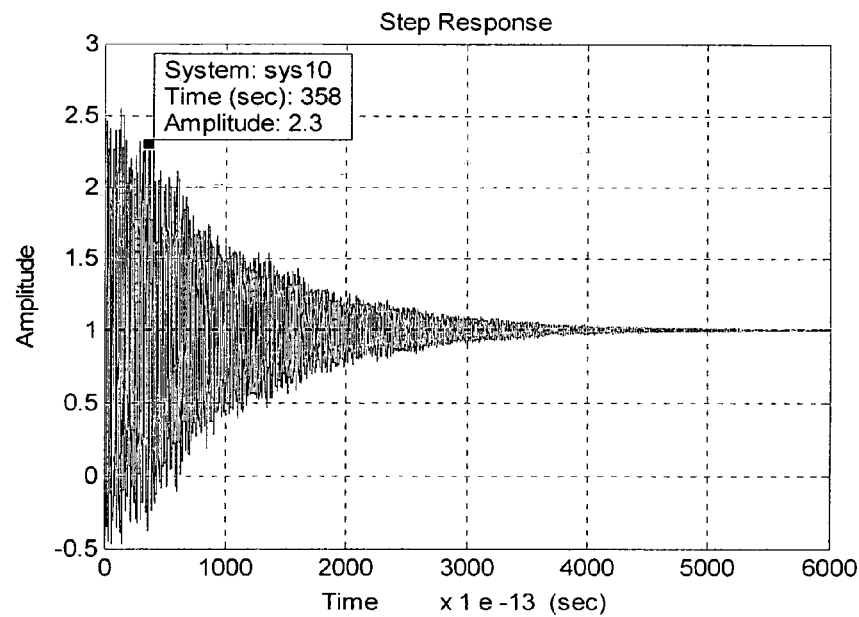
Fig.11. Step Responses of an Original Model and its 20-th Order ELO Model ($n = 10$) in Model 4
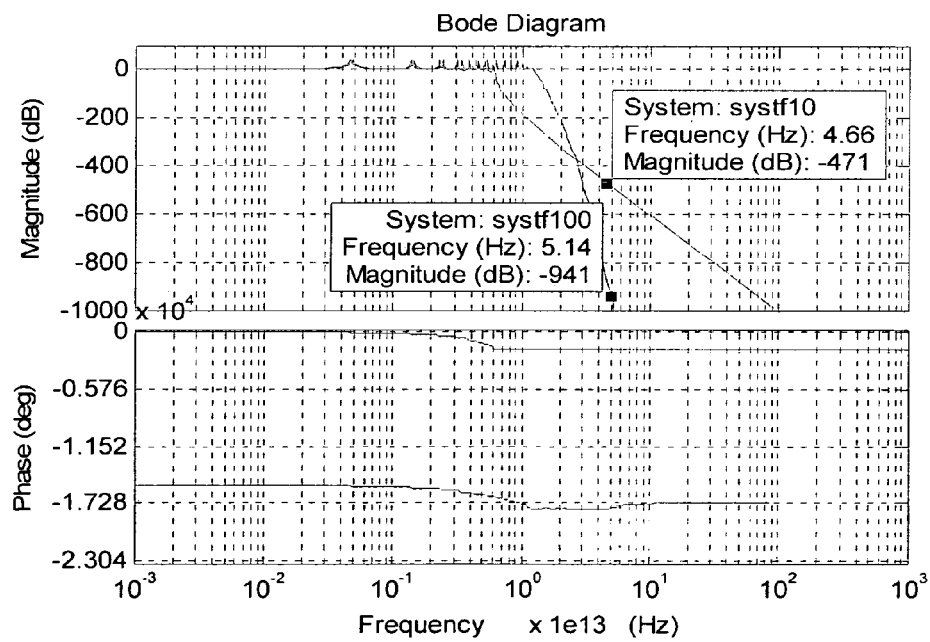
Fig.12. Bode Plots of an Original Model and its 20-th Order ELO Model ($n = 10$) in Model 4

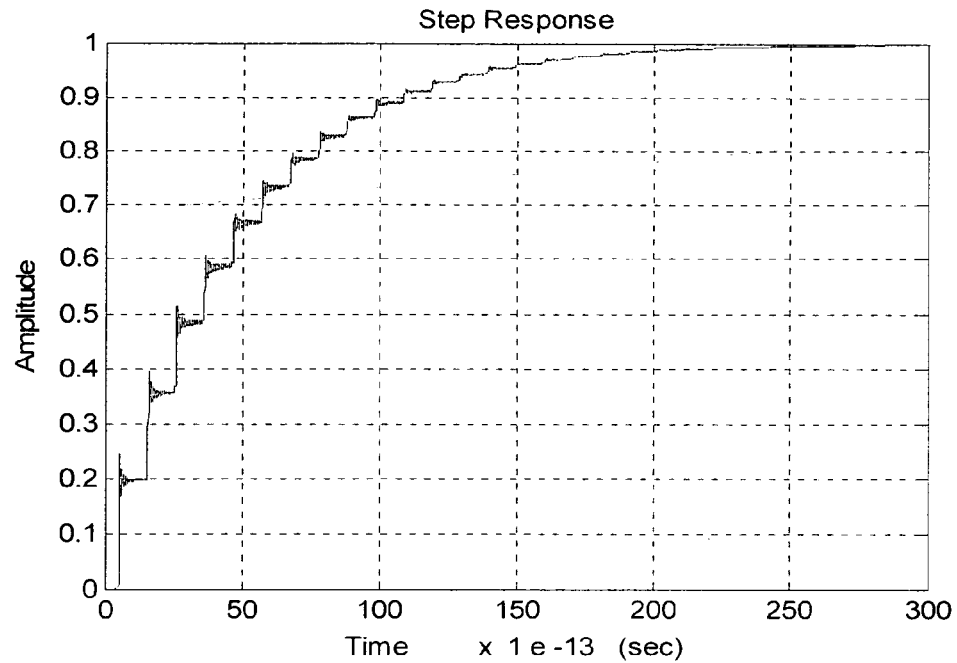
Fig.13. Step Response of the Original Model with Source and Load in Model 3
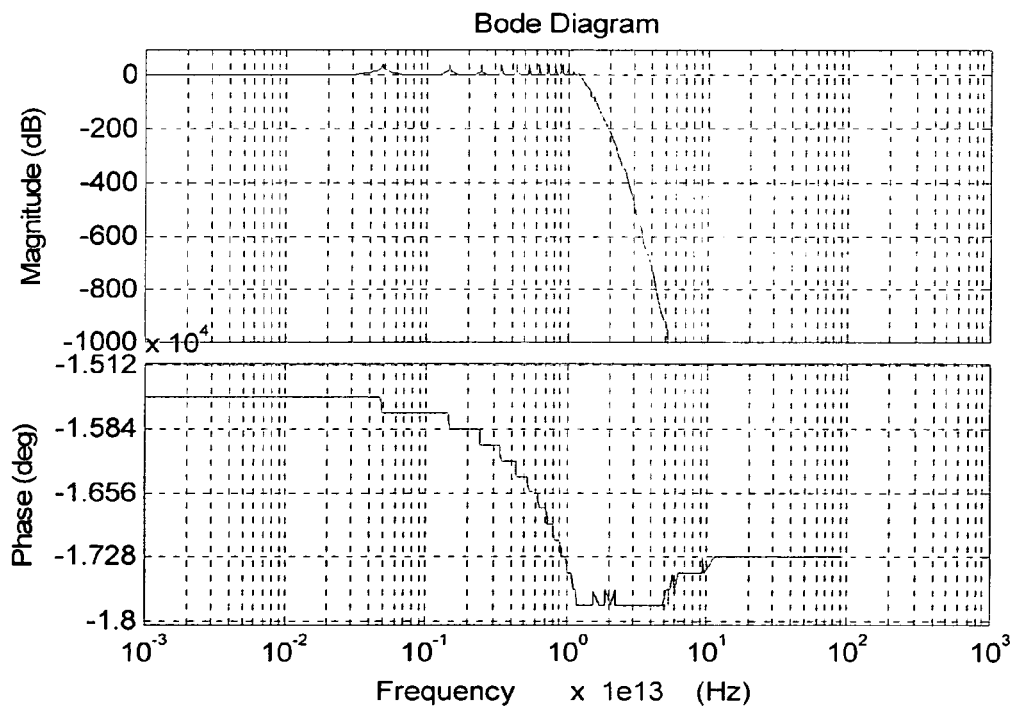
Fig.14. Bode Plot of the Original Model with Source and Load in Model 3

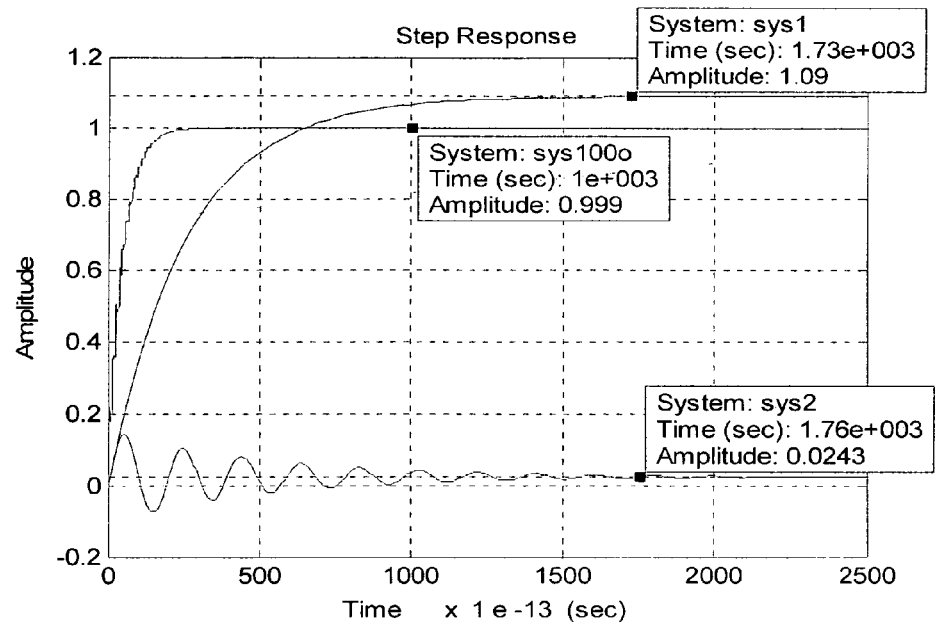
Fig.15. Step Responses of an Original Model and its (1-st & 2-nd) BTM Models in Model 3
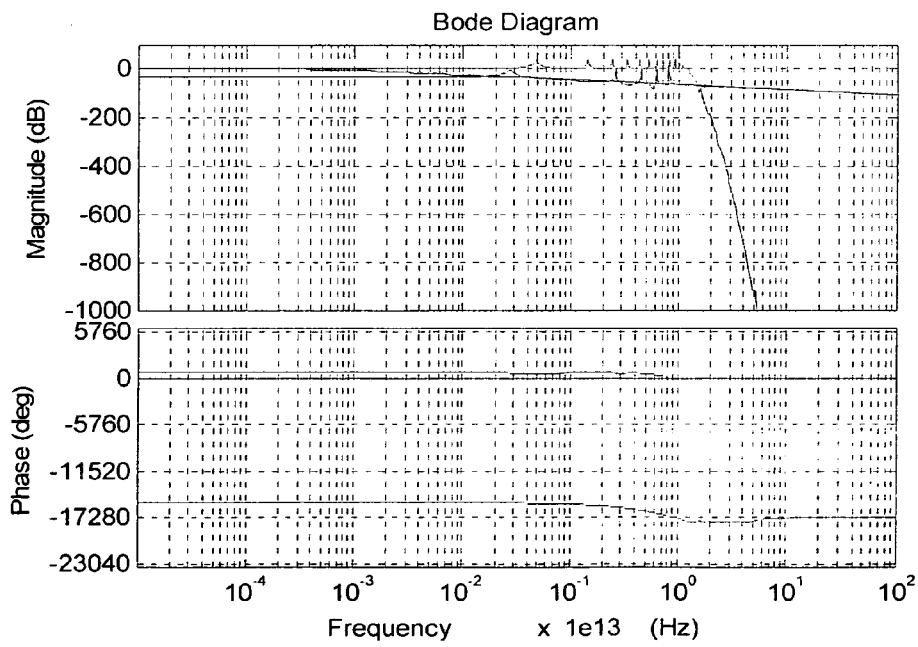
Fig.16. Bode Plots of an Original Model and its BTM (1-st and 10-th) Models in Model 3

METHODS TO GENERATE STATE SPACE MODELS BY CLOSED FORMS AND TRANSFER FUNCTIONS BY RECURSIVE ALGORITHMS FOR RLC INTERCONNECT AND TRANSMISSION LINE AND THEIR MODEL REDUCTION AND SIMULATIONS

This application claims the benefit of U.S. Provisional Application No. 60/537,351 filed Jan. 20, 2004, and entitled as the above.

STATEMENT REGARDING FEDERALLY SPONSORED RESEARCH OR DEVELOPMENT

This invention was made with Government support under the NSF CCR 0098275 awarded by the National Science Foundation. The Government has certain rights in this invention.

CROSS-REFERENCE TO RELATED APPLICATIONS

No Related Nonprovisional Application

REFERENCE TO SEQUENCE LISTING, A TABLE, OR A COMPUTER PROGRAM LISTING COMPACT DISK APPENDIX

Not Applicable

OTHER REFERENCES

S.-G. Wang, J. Wang, W. Cai, D. Zhou and X. Zhen, "Modeling of RC Interconnect Circuit and Its Recursive Algorithm", *Proceedings of the IEEE* 2002 *International Conference on Control andAutomation (ICCA '02)*, pp. 1426–1430, Xiaman, China, Jun. 16–19, 2002.

M. Reed and R. Rohrer, *Applied Introductory Circuit Analysis for Electrical and Computer Engineering*, Prentice Hall, Upper Saddle River, N.J., 1999.

BACKGROUND OF THE INVENTION

1. Field of the Invention

The present invention relates to RLC interconnect and transmission line, and methods to obtain their state space model in time domain and transfer function in frequency domain, and their simulations for their characteristics and evolution, and their practice for various model reduction methods.

2. Description of the Related Art

Over times, VLSI has become larger with more and smaller transistors per square centimeter. With the rapid increase of integration level and speed, IC interconnect becomes one of the important limiting factors of today's VLSI circuit design performance. It has become well accepted that interconnect delay dominates gate delay in current deep submicrometer VLSI circuits. With the continuous scaling of technology and increased die area, especially the chip operation speed increasing, that situation is becoming worse. The average length of the chip interconnect and the chip area occupied by interconnect are both increasing. The advance of high-speed deep-submicron VLSI technology requires chip interconnect and packaging to be modeled by distributed circuits [Reed and Rohrer 1999, Wang et al. 2002]. Such a detailed modeling level eventually results in large scale linear RLC or RC circuits to be analyzed. In transmission line area, it is also well know that the transmission line should be modeled as distributed circuits, resulting in large scale linear RLC or RC circuits. When the chip speed is increased fast, the inductor characteristics of interconnect and transmission line must be considered.

In circuit design, fast and accurate computer simulation of the behavior of the circuit is important. That is especially true with VLSI, in which hundreds of thousands of circuit elements can be placed on a single chip, and with ULSI, in which millions of circuit elements can be placed on a single chip.

The increasing size of integrated systems creates an explosion in interconnect modeling complexity of unmanageable proportions. As the interconnect complexity gradually increases, its electrical design becomes more challenging. An effort of reducing the circuit order (or size) is then necessary in order to evaluate the circuit performance and characteristics in a reasonable time period, as required by real design practice. The process of reducing linear system order is called linear system order reduction.

In order to design complex circuits properly, accurate characterization of the interconnect behavior and signal transients is required. One interconnect in a VLSI circuit is commonly structured in a single line, a tree and a net. However, a single line is a basic component for a tree and a net. Thus, the process of characterizing signal waveforms in a single line structured interconnect is of primary basis and importance.

There are various model reduction methods, such as Elmore delay model, AWE (Asymptotic Waveform Evaluation) for timing analysis, PVL (Padé approximation via Lanczos approach), Klyrov space decomposition, Klyrov-Amoldi-based reduced-order modeling, BTM (Balance Truncation Method), and old traditional even length-division order (ELO) modeling.

However, almost all model reduction methods in the state space need to start from an accurate state space high order models of interconnect and transmission line in order to result in a good model reduction, such as Klyrov space method, BTM, ELO, PVL and Arnoldi-based method needs state space system matrix A and input matrix B in state space. On the other hand, model reduction methods in frequency domain via the transfer function need either to start from the above state space model or its accurate transfer function model, such as Elmore model and AWE and ELO.

The original accurate models in state space equation and transfer function are important not only as a basis of an accurate starting point for all various model reduction methods, but also as a basis of performance comparison for checking the approximation of all various model reduction methods:

It is noticed that to get an accurate state space model for the starting point has significantly high computational complexity as shown as follows, in addition to the high computation complexity of model reduction techniques themselves. It is well known that an RC and an RLC interconnect and transmission line can be described as the following differential equation in matrix form based on the KCL or KVL:

$$Gx(t) + C_{LC}\frac{dx(t)}{dt} = bu(t) \qquad (1)$$

where G and $C_{LC}$ are parameter matrices related to the parameters of resisters, capacitors and inductors of the interconnect and transmission line and the structure of the line, tree and net, u(t) is the input source vector and x(t) is a vector of the node voltages and inductor currents or the node voltage derivatives. The state space model {A,B,C,D} of an RLC interconnect and transmission line is in $$\dot{x}(t)=Ax(t)+Bu(t), y(t)=Cx(t)+Du(t), \quad (2)$$

where the state variable $x(t) \in R^{2n}$, input variable $u(t) \in R$ and output variable $y(t) \in R$, and the order 2n is the number of capacitors and inductors in the circuit (a line, tree or net). Thus, it is apparent from equation (1) that the calculation of inverse of matrix $C_{LC}$ and multiplication of $C_{LC}^{-1}$ with matrix G and vector b are necessary to get matrix A and matrix B in the state space model. From the well known results, the computation complexity of only matrix inverse is $O(n^2) \sim O(n^3)$ depending on the matrix structure and the inverse algorithm, and the computation complexity of n×n matrix multiplication is also $O(n^3)$ usually. For very high order system, the matrix inverse calculation leads to calculation singularity problem due to bad condition number of the matrix, making a calculation problem. Note that n should be as large as we can for approaching to a distributed model, and on the other hand, it can be in the order of thousands for a typical large industrial net.

To avoid this difficulty, it is usual to take a suitable small or middle size of order for the original model of distributed RC and RLC interconnect and transmission line by using even length division with its parameters proportional to their length.

It is noticed that the limited number of orders or poles is inappropriate to evaluate the transient response at the nodes of underdamped RLC interconnect and transmission line, which require a much higher order model to accurately capture the transient response. However, highly accurate estimation of signal transients within a VLSI circuit is required for performance-critical modules and nets and to accurately anticipate possible hazards during switching. Also, the increasing performance requirements forces the reduction of the safety margins used in a worst case design, requiring a more accurate delay characterization.

An exact original high order model is much important not only as a starting point for all model reduction methods, but also as an evaluation criterion for all reduced order models. In that an exact original model of a single line interconnect and a transmission line is primary important because it is a basic structure of interconnect and transmission line, but also a basic element to build a tree structure and a net structure of interconnect and transmission lines. However, due to very large size of the original interconnect model, an important and difficult aspect is how to have a method get its original model in a suitable time and cost-less calculation time. It should be and has to be an exact accurate model of such large order. It not only provides an accurate starting point for model reduction, but also is a basis for checking and evaluating of reduced model performance.

Furthermore, when uncertainties are considered, to investigate robustness of the performance of the VLSI including interconnects needs a thorough and careful knowledge of interconnects, i.e., its accurate model.

The way to find this distributed linear model usually is from the s-domain by Kirchhoff's law and algebraic equations or from the time domain by Kirchhoff's law and differential equations. However, it is bound to meet calculation of so-high dimension matrix inverse in conventional methods. Due to the distributed interconnect characteristics, the size is very large, e.g., a $10^6 \times 10^6$ matrix, it is desired to have an elegant closed-form of the state space model and an effective recursive algorithm of the transfer function model for the RC and RLC distributed interconnects and transmission lines to dramatically reduce the calculation complexity. Moreover, simulations based on these models can be developed to capture the transient response in exact or arbitrary accuracy.

It is noticed that there exists some kind of simple algorithms in finding transfer function of interconnect and transmission line. However, it is only an approximation to exact transfer function due to no consideration of load effect or under an assumption of no load effect. One simple example of two-section RC interconnect shows the approximation error. The simple rough method takes a multiplication of each individual section transfer function and leads to a transfer function as $$T_{12}(s) = \frac{1}{1+R_1C_1s} \cdot \frac{1}{1+R_2C_2s} = \quad (3)$$
$$= \frac{1}{R_1C_1R_2C_2s^2 + (R_1C_1 + R_2C_2)s + 1}$$
$$= \frac{1/(R_1C_1R_2C_2)}{s^2 + \left(\frac{1}{R_1C_1} + \frac{1}{R_2C_2}\right)s + \frac{1}{R_1C_1R_2C_2}}.$$

However, the exact transfer function of this two-section RC is $$T_{12}(s) = \frac{1}{R_1C_1R_2C_2s^2 + (R_1C_1 + R_2C_1 + R_2C_2)s + 1} \quad (4)$$
$$= \frac{1/(R_1C_1R_2C_2)}{s^2 + \left(\frac{1}{R_1C_1} + \frac{1}{R_2C_2} + \frac{1}{R_1C_2}\right)s + \frac{1}{R_1C_1R_2C_2}}$$

It is obvious to see the difference of equation (4) from equation (3).

Notice that the disclosed recursive algorithm requires a recursive algorithm involving two-variable steps back data. This method and algorithm exactly recover the exact transfer function in a so effective way in both systematic elegance and calculation complexity. Thus, this fact implies that all one-variable step back recursive algorithms are either not correct for an exact transfer function derivation if no load effect adjustment, or not efficient in computation complexity for derivation of the exact transfer function.

In all, current conventional methods are lack of an elegant way to get exact original high order state space model and effective recursive transfer function of distributed interconnect and transmission line.

SUMMARY OF THE INVENTION

In light of the above, it will be apparent that a need exists in the art for RLC interconnect and transmission line circuit model and its analysis method and system which can accurately capture the original model and the transient responses at all nodes in a computationally efficient manner.

It is therefore a primary object of the invention to provide a method and system for establishing an exact accurate state space model by an efficient closed form in time domain and an exact accurate transfer function model by an efficient recursive algorithm in frequency domain for RLC interconnect and transmission line.

It is another objective of the invention to provide the said exact models as a basis for evaluating the transient response of an RLC interconnect and transmission line using various existing model reduction/approximation methods and the herein developed methods.

It is another objective of the invention to provide a method and a system and a base for searching a simple model reduction and/or an optimized model reduction of an RLC interconnect and transmission line using the above said exact accurate models together with various model reduction methods.

It is another object of the invention to provide such said methods and systems which can do so in a computationally efficient manner.

It is yet another object of the invention to provide such a method and system of the model reduction having a high degree of stability in terms of both numerical stability and pole stability and physical synthesizable.

In short, it is a key objective of this present invention to provide exact accurate 2n-th order models and their simple algorithms of RLC interconnect and transmission line by the said closed form of the state space model in time domain and the said recursive algorithm of the transfer function model in frequency domain. The main features include the exact accuracy of the models and high efficiency of the algorithms.

To achieve the above and other objects, the present invention is directed to a method and system for establishing the exact accuracy original models of the RLC interconnect and transmission line in both time domain and frequency domain in a computationally efficient way ($O(n^2)$ multiplication complexity,). For evenly distributed RLC interconnect and transmission line, the said closed form of state space model has its computation complexity of only a fixed constant, i.e., $O(1)$. The present invention also has guaranteed stability properties for low order approximations as compared to AWE, which can be a useful feature with RLC interconnect and transmission lines.

The method and system to establish the original 2n-th order models operate as follows. The order of the distributed circuits is assumed as 2n as general. Thus, the RLC interconnect and/or transmission line has n pieces as shown in FIG. 1, each having a resistor and an inductor in series between two neighbor nodes and a capacitor from the node to the ground. The input port is with a source voltage $v_{in}(t)$ and the output port is then with a voltage $v_o(t)$. Their distributed resistances are denoted as $R_i$, $i=1, \ldots, n$, the distributed inductances are denoted as $L_i$, $i=1, \ldots, n$, and the distributed capacitors are denoted as $C_i$, $i=1, \ldots, n$. The subscripts are ordered from the output terminal to the input terminal, different from the normal way from the input terminal to the output terminal. The nodes and their voltages are also numbered in this way as node i and its voltage $v_i(t)$, $i=1, \ldots, n$. The advantage of this treatment will be shown in the following when the recursive algorithm is developed. It provides an insight into the general format of the model. This general interconnect/transmission line has a source resistor $R_s$ and a load resistor $R_0$ and a load capacitor $C_0$. We call this Circuit Model 1 in FIG. 1.

Consider Circuit Model 1 and take the state variable vector x(t), the input variable u(t) and the output variable y(t) as $$x(t)=[v^T(t)\dot{v}^T(t)]^T, v(t)=[v_n(t), v_{n-1}(t), \ldots, v_1(t)]^T,$$
$$u(t)=v_{in}(t), \text{ and } y(t)=v_o(t)=v_1(t), \quad (5)$$

respectively, where the state variable $x(t) \in R^{2n}$, the input variable $u(t) \in R$ and the output variable $y(t) \in R$ for the considered distributed interconnect circuit. Then, its spate space model $\{A,B,C,D\}$ of the distributed RLC circuit in FIG. 1 is as follows:

$$\dot{x}(t) = Ax(t) + Bu(t) \quad \text{and} \quad y(t) = Cx(t) + Du(t) \quad (6)$$

$$A = \begin{bmatrix} 0 & I \\ A_{21} & A_{22} \end{bmatrix}, \quad (7)$$

$$A_{21} = \begin{bmatrix}
-\frac{1}{C_n}\left(\frac{1}{L_n}+\frac{1}{L_{n-1}}\right) & \frac{1}{C_n L_{n-1}} & 0 & \cdots & 0 & 0 & \frac{1}{R_0 C_n}\left(\frac{R_{n-1}}{L_{n-1}} - \frac{R_n+R_S}{L_n}\right) \\
\frac{1}{C_{n-1}L_{n-1}} & -\frac{1}{C_{n-1}}\left(\frac{1}{L_{n-1}}+\frac{1}{L_{n-2}}\right) & \frac{1}{C_{n-1}L_{n-2}} & \cdots & 0 & 0 & \frac{1}{R_0 C_{n-1}}\left(\frac{R_{n-2}}{L_{n-2}} - \frac{R_{n-1}}{L_{n-1}}\right) \\
0 & \frac{1}{C_{n-2}L_{n-2}} & -\frac{1}{C_{n-2}}\left(\frac{1}{L_{n-2}}+\frac{1}{L_{n-3}}\right) & \cdots & 0 & 0 & \frac{1}{R_0 C_{n-2}}\left(\frac{R_{n-2}}{L_{n-3}} - \frac{R_{n-2}}{L_{n-2}}\right) \\
\vdots & \vdots & \vdots & \ddots & \vdots & \vdots & \vdots \\
0 & 0 & 0 & \cdots & -\frac{1}{C_3}\left(\frac{1}{L_3}+\frac{1}{L_2}\right) & \frac{1}{C_3 L_2} & \frac{1}{R_0 C_2}\left(\frac{R_2}{L_2} - \frac{R_3}{L_3}\right) \\
0 & 0 & 0 & \cdots & \frac{1}{C_2 L_2} & -\frac{1}{C_2}\left(\frac{1}{L_2}+\frac{1}{L_1}\right) & \frac{1}{C_2 L_1} + \frac{1}{R_0 C_2}\left(\frac{R_1}{L_1} - \frac{R_2}{L_2}\right) \\
0 & 0 & 0 & \cdots & 0 & \frac{1}{(C_1+C_0)L_1} & -\frac{R_0+R_1}{R_0(C_1+C_0)L_1}
\end{bmatrix} \quad (8)$$

-continued $$A_{22} = \begin{bmatrix} -\frac{R_n + R_s}{L_n} & \frac{C_{n-1}}{C_n}\left(\frac{R_{n-1}}{L_{n-1}} - \frac{R_n + R_s}{L_n}\right) & \frac{C_{n-2}}{C_n}\left(\frac{R_{n-1}}{L_{n-1}} - \frac{R_n + R_s}{L_n}\right) & \cdots & \frac{C_2}{C_n}\left(\frac{R_{n-1}}{L_{n-1}} - \frac{R_n + R_s}{L_n}\right) & \frac{C_1 + C_0}{C_n}\left(\frac{R_{n-1}}{L_{n-1}} - \frac{R_n + R_s}{L_n}\right) \\ 0 & -\frac{R_{n-1}}{L_{n-1}} & \frac{C_{n-2}}{C_{n-1}}\left(\frac{R_{n-2}}{L_{n-2}} - \frac{R_{n-1}}{L_{n-1}}\right) & \cdots & \frac{C_2}{C_{n-1}}\left(\frac{R_{n-2}}{L_{n-2}} - \frac{R_{n-1}}{L_{n-1}}\right) & \frac{C_1 + C_0}{C_{n-1}}\left(\frac{R_{n-2}}{L_{n-2}} - \frac{R_{n-1}}{L_{n-1}}\right) \\ 0 & 0 & -\frac{R_{n-2}}{L_{n-2}} & \cdots & \frac{C_2}{C_{n-2}}\left(\frac{R_{n-3}}{L_{n-3}} - \frac{R_{n-2}}{L_{n-2}}\right) & \frac{C_1 + C_0}{C_{n-2}}\left(\frac{R_{n-3}}{L_{n-3}} - \frac{R_{n-2}}{L_{n-2}}\right) \\ \vdots & \vdots & \vdots & \ddots & \vdots & \vdots \\ 0 & 0 & 0 & \cdots & -\frac{R_2}{L_2} & \frac{C_1 + C_0}{C_2}\left(\frac{R_1}{L_1} - \frac{R_2}{L_2}\right) \\ 0 & 0 & 0 & \cdots & 0 & -\frac{R_1}{L_1} - \frac{1}{R_0(C_1 + C_0)} \end{bmatrix} \quad (9)$$

$$B = \begin{bmatrix} 0 \\ B_1 \end{bmatrix}, B_1 = \begin{bmatrix} \frac{1}{C_n L_n} \\ 0 \\ \vdots \\ 0 \end{bmatrix}, C = [J \ 0], J = [0 \ \cdots \ 0 \ 1] \text{ and } D = 0 \quad (10)$$

where $A \in R^{2n \times 2n}$, $A_{21} \in R^{n \times n}$, $A_{22} \in R^{n \times n}$, $B \in R^{1 \times 2n}$, $B_1 \in R^{1 \times n}$, $C \in R^{2n \times 1}$, $J \in R^{n \times 1}$, and $D \in R$. It is a closed form of the exact space state model for the 2n-th order distributed interconnect and transmission line of Model 1 in FIG. 1, where n>>1 usual. However, it is also valid for any n>1.

For a special case n=1, the above model is reduced and will be described in late section. It usually relates to the model reduction, while the distributed interconnect characters are captured by a very large order n.

Then the method to establish the state space model is as follows:

Method SS1 (state space model 1):
i) Set order 2n.
ii) Set the state matrix A as (7)
   First Set $A_{11}=0$, a $n \times n$ zero matrix; (11)

$A_{12}=I$, a $n \times n$ identity matrix; (12)

$A_{21}$ as (8), and (13)

$A_{22}$ as (9), then set (14)

$$A = \begin{bmatrix} A_{11} & A_{12} \\ A_{21} & A_{22} \end{bmatrix} \quad (15)$$

iii) Set the input matrix B, an 2n×1 column vector as (10)

(a) $b_i = 0, i = 1, \ldots, 2n$, then (b) $b_{n+1} = \frac{1}{C_n L_n}$ (16)

iv) Set the output matrix C, an 1×2n row vector as (10)

(a) $c_i=0, i=1, \ldots, 2n$, then (b) $c_j=1, j \in I[1,n]$; usually j=n, (17)

to select node n−j+1 as the output node for checking this node voltage.

v) Set the direct output scalar D=0.
vi) Thus, the state space model {A,B,C,D} is established for Model 1.

Another common model to describe a circuit system is its transfer function which specifies the relationship from the input signal vector to the output signal vector in s-domain (frequency domain). The transfer function of the distributed RLC interconnect circuit Model 1 in FIG. 1 is derived as follows by an efficient recursive algorithm.

Consider the distributed RLC circuit in FIG. 1. Take the corresponding state variable, input and output variables are the same as in (5). Then, the transfer function of the circuit in FIG. 1 from the input $v_{in}(t)$ to the output $v_o(t)$ and its recursive algorithm are follows:

$$T_n(s) = \frac{N_n(s)}{D_n(s)} \quad (18)$$

$$N_n(s) = 1 \text{ and} \quad (19)$$

$$\Delta_1 = (C_1 + C_0)s + \frac{1}{R_0}, \quad (20)$$

$$D_1(s) = s(L_1 s + R_1)(C_1 + C_0) + 1 + \frac{L_1 s + R_1}{R_0}$$

$$\Delta_j = sC_j D_{j-1}(s) + \Delta_{j-1}, \quad (21)$$

$$D_j(s) = (L_j s + R_j)\Delta_j + D_{j-1}(s), j = 2, \ldots, n-1$$

$$\Delta_n = sC_n D_{n-1}(s) + \Delta_{n-1}, \quad (22)$$

$$D_n(s) = (L_n s + R_n + R_s)\Delta_n + D_{n-1}(s), n > 2$$

where 2n is the order of the circuit system, the transfer function numerator polynomial is $N_n(s)$ and its characteristic polynomial (denominate polynomial) is $D_n(s)$.

Thus, the recursive algorithm for the transfer function from the source voltage signal to the voltage of node 1 (or the same node 0) of Model 1 includes the following steps:

Method TF1 (transfer function model 1):
(i) Set the numerator of the transfer function as (19)

$N_n(s)=1;$ (23)

(ii) Set the recursive initiate values $$D_1(s) = s(L_1 s + R_1)(C_1 + C_0) + 1 + \frac{L_1 s + R_1}{R_0} \text{ and} \quad (24)$$

$$\Delta_1 = (C_1 + C_0)s + \frac{1}{R_0};$$

(iii) For j=2, . . . ,n−1

$$\Delta_j = sC_j D_{j-1}(s) + \Delta_{j-1} \quad (25)$$

$$D_j(s) = (L_j s + R_j)\Delta_j + D_{j-1}(s) \quad (26)$$

end (iv) Set $\Delta_n = sC_n D_{n-1}(s) + \Delta_{n-1}$ and $D_n(s) = (L_n s + R_n + R_s)\Delta_n + D_{n-1}(s)$ for n>2; (27)

(v) Then, the transfer function model is $T_n(s) = \dfrac{N_n(s)}{D_n(s)}$. (28)

The case to consider distributed interconnect and transmission line themselves without the affect of and any distortion by source and load elements (Model 2) in FIG. 2 can be viewed as a special case of Model 1 in FIG. 1 by setting the source resistor and load capacitor to be zero and the load resistor to be infinite as $$R_s = 0, \ C_0 = 0, \ \text{and} \ \frac{1}{R_0} = 0. \quad (29)$$

Another special case is that a considered interconnect and/or transmission line of Model 1 in FIG. 1 is an even distributed interconnect and/or transmission line (Model 3) in FIG. 3. In this case, all piece resistors, inductors and capacitors are respectively the same as $$R_i = R, \ C_i = C \text{ and } L_i = L, \ i=1, \ldots, n. \quad (30)$$

They are related to the parasitic parameters of the interconnect and transmission line as $$R = R_t/n, \ C = C_t/n \text{ and } L = L_t/n \quad (31)$$

where parasitic resistor $R_t$, capacitor $C_t$ and inductor $L_t$ are the "total" resistor, "total" capacitor and "total" inductor of the interconnect, respectively. Here, the quote is used for "total" because it is really distributed, not total.

One further special case (Model 4) is the even distributed interconnect and/or transmission line of Model 3 in FIG. 3 but without the source and load part elements as shown in FIG. 4. Thus, it is also a special case of Model 2 with the special condition of even distribution in (30) and (31).

The corresponding time domain analysis and frequency domain analysis can be easily executed by the derived state space closed-form formulas and transfer functions such as by function command step and bode in MATLAB.

In consideration of model reduction for the interconnect and transmission line, an easy synthesizable and implemented model is proposed here as 2m-th order corresponding models described above with the best parameters such that the various defined optimal model reduction performance index is minimized. It is preferred to use even distributed 2m-th order models for simplicity of reduced order models. The above said state space closed-form and transfer function recursive algorithm are used for searching optimal model reduction parameters. Because the reduced models have the same structures as Models 1–4, its synthesizability is obvious by using corresponding low order RLC interconnect and transmission line in FIGS. 1–4 but with 2m-th order, i.e., m sections.

The above said closed forms and transfer functions can be used for analysis of approximation models of the traditional 2m-th order parasitic RLC interconnect and transmission line by even length division in model reduction. We call this tradition 2m-th order parasitic model as Even Length Order (ELO) reduced model. Thus, the above presented method and algorithm can be used for evaluation of the traditional ELO reduced models.

In one preferred embodiment of the present invention, an RLC interconnect and transmission line is just itself, not including its source and load parts, for model reduction without any distortion. Then this reduced order model is connected to its real source and load parts. Thus, this reduced model is not infected and is able to connect to various source and load parts.

Variations of the present invention can include a combination of any partial invention in the present invention and any current conventional method of RLC interconnect and transmission line modeling and analysis or any mixture of current conventional method of RLC interconnect and transmission line modeling and analysis.

BRIEF DESCRIPTION OF THE DRAWINGS

A preferred embodiment of the present invention will be set forth in detail with reference to the drawings, in which:

FIG. 1 shows a general RLC interconnect and transmission line circuit with a source resistor and a load resistor and a load capacitor (Model 1);

FIG. 2 shows a general RLC interconnect and transmission line circuit itself (Model 2);

FIG. 3 shows an evenly distributed RLC interconnect and transmission line with a source resistor and a load resistor and a load capacitor (Model 3);

FIG. 4 shows an evenly distributed RLC interconnect and transmission line itself (Model 4);

FIG. 5 shows the step transient response evaluated for an example RLC interconnect of FIG. 4 (Model 4);

FIG. 6 shows the Bode plot evaluated for an example RLC interconnect of FIG. 4 (Model 4);

FIG. 7 shows the step transient responses evaluated for an example RLC interconnect of FIG. 4 (Model 4) and its second order (one division n=1) ELO (Even Length-Order) reduction model;

FIG. 8 shows the Bode plots evaluated for an example RLC interconnect of FIG. 4 (Model 4) and its second order ELO model;

FIG. 9 shows the step transient responses evaluated for an example RLC interconnect of FIG. 4 (Model 4) and its fourth order (n=2) ELO (Even Length-Order) reduction model;

FIG. 10 shows the Bode plots evaluated for an example RLC interconnect of FIG. 4 (Model 4) and its fourth order (n=2) ELO model;

FIG. 11 shows the step transient responses evaluated for an example RLC interconnect of FIG. 4 (Model 4) and its 20-th order (n=10) ELO (Even Length-Order) reduction model;

FIG. 12 shows the Bode plots evaluated for an example RLC interconnect of FIG. 4 (Model 4) and its 20-th order (n=10) ELO model;

FIG. 13 shows the step transient response evaluated for an example RLC interconnect of FIG. 3 (Model 3);

FIG. 14 shows the Bode plot evaluated for an example RLC interconnect of FIG. 3 (Model 3);

FIG. 15 shows the step transient responses evaluated for an example RLC interconnect of FIG. 3 (Model 3) and its BTM models of orders one and two;

FIG. 16 shows Bode plots evaluated for an example RLC interconnect of FIG. 3 (Model 3) and its BTM models of orders one and ten.

DETAILED DESCRIPTION OF THE PREFERRED EMBODIMENTS

A preferred embodiment of the present invention will now be set forth in detail with reference to the drawings.

The rules governing and the methods finding the state space model parameters in an RLC interconnect are defined in the said closed forms in subsection A. The method used to calculate the exact transfer functions at the output node of an RLC interconnect and transmission line is introduced in subsection B. Those interconnect and transmission line reduction models are discussed in subsection C. The use of performance evaluation to determine a reduction model approximation is discussed in subsection D. The stability and complexity characteristics of the methods are described in subsection E. Finally experimental results are given in subsection F.

A. Calculating the State Space Models Directly

A.1. Model 1—with its Source and Load Parts:

One preferred embodiment is Model 1 as shown in FIG. 1 and briefly described in the above summary. It is obvious to see that the state space model in (6) has System matrix A in (7)–(9), Input matrix B, Output matrix C and Direct Output matrix in (10), respectively, as Here, the sub-system matrix $A_{21}$ has elements in the last column and tri-diagonals: super-diagonal, diagonal and sub-diagonal. Its tri-diagonals in the i-th row have elements $C_{n-i+1}$, $L_{n-i+1}$ and $L_{n-i}$, and their sum equals to 0 for i=2, ... ,n−2. Its last column has elements all with the load resistor $R_0$. The $1^{st}$ row has elements $C_n$, $L_n$, $L_{n-}$, $R_n$, $R_{n-1}$ and source resistor $R_s$. The (n−1)-th row sum is $$\frac{1}{R_0 C_2}\left(\frac{R_1}{L_1} - \frac{R_2}{L_2}\right).$$

The last n-th row has elements $C_1$, $L_1$, $R_1$ and load resistor $R_0$ and capacitor $C_0$, and its row sum equals to $$-\frac{R_1}{R_0(C_1 + C_0)L_1}.$$

Its diagonal entries have negative sign as $$a_{21}^{ii} = -\frac{1}{C_{n-i+1}}\left(\frac{1}{L_{n-i+1}} + \frac{1}{L_{n-i}}\right), i = 1, \ldots, \tag{36}$$

$$A = \begin{bmatrix} 0 & I \\ A_{21} & A_{22} \end{bmatrix}, \tag{32}$$

$$A_{21} = \begin{bmatrix}
-\frac{1}{C_n}\left(\frac{1}{L_n}+\frac{1}{L_{n-1}}\right) & \frac{1}{C_n L_{n-1}} & 0 & \cdots & 0 & 0 & \frac{1}{R_0 C_n}\left(\frac{R_{n-1}}{L_{n-1}}-\frac{R_n+R_S}{L_n}\right) \\
\frac{1}{C_{n-1}L_{n-1}} & -\frac{1}{C_{n-1}}\left(\frac{1}{L_{n-1}}+\frac{1}{L_{n-2}}\right) & \frac{1}{C_{n-1}L_{n-1}} & \cdots & 0 & 0 & \frac{1}{R_0 C_{n-1}}\left(\frac{R_{n-2}}{L_{n-2}}-\frac{R_{n-1}}{L_{n-1}}\right) \\
0 & \frac{1}{C_{n-2}L_{n-2}} & -\frac{1}{C_{n-2}}\left(\frac{1}{L_{n-2}}+\frac{1}{L_{n-3}}\right) & \cdots & 0 & 0 & \frac{1}{R_0 C_{n-2}}\left(\frac{R_{n-3}}{L_{n-3}}-\frac{R_{n-2}}{L_{n-2}}\right) \\
\vdots & \vdots & \vdots & \ddots & \vdots & \vdots & \vdots \\
0 & 0 & 0 & \cdots & -\frac{1}{C_3}\left(\frac{1}{L_3}+\frac{1}{L_2}\right) & \frac{1}{C_3 L_2} & \frac{1}{R_0 C_3}\left(\frac{R_2}{L_2}-\frac{R_3}{L_3}\right) \\
0 & 0 & 0 & \cdots & \frac{1}{C_2 L_2} & -\frac{1}{C_2}\left(\frac{1}{L_2}+\frac{1}{L_1}\right) & \frac{1}{C_2 L_1}+\frac{1}{R_0 C_2}\left(\frac{R_1}{L_1}-\frac{R_2}{L_2}\right) \\
0 & 0 & 0 & \cdots & 0 & \frac{1}{(C_1+C_0)L_1} & -\frac{R_0+R_4}{R_0(C_1+C_0)L_1}
\end{bmatrix} \tag{33}$$

$$A_{22} = \begin{bmatrix}
-\frac{R_n+R_s}{L_n} & \frac{C_{n-1}}{C_n}\left(\frac{R_{n-1}}{L_{n-1}}-\frac{R_n+R_s}{L_n}\right) & \frac{C_{n-2}}{C_n}\left(\frac{R_{n-1}}{L_{n-1}}-\frac{R_n+R_s}{L_n}\right) & \cdots & \frac{C_2}{C_n}\left(\frac{R_{n-1}}{L_{n-1}}-\frac{R_n+R_s}{L_n}\right) & \frac{C_1+C_0}{C_n}\left(\frac{R_{n-1}}{L_{n-1}}-\frac{R_n+R_s}{L_n}\right) \\
0 & -\frac{R_{n-1}}{L_{n-1}} & \frac{C_{n-2}}{C_{n-1}}\left(\frac{R_{n-2}}{L_{n-2}}-\frac{R_{n-1}}{L_{n-1}}\right) & \cdots & \frac{C_2}{C_{n-1}}\left(\frac{R_{n-2}}{L_{n-2}}-\frac{R_{n-1}}{L_{n-1}}\right) & \frac{C_1+C_0}{C_{n-1}}\left(\frac{R_{n-2}}{L_{n-2}}-\frac{R_{n-1}}{L_{n-1}}\right) \\
0 & 0 & -\frac{R_{n-2}}{L_{n-2}} & \cdots & \frac{C_2}{C_{n-2}}\left(\frac{R_{n-3}}{L_{n-3}}-\frac{R_{n-2}}{L_{n-2}}\right) & \frac{C_1+C_0}{C_{n-2}}\left(\frac{R_{n-3}}{L_{n-3}}-\frac{R_{n-2}}{L_{n-2}}\right) \\
\vdots & \vdots & \vdots & \ddots & \vdots & \vdots \\
0 & 0 & 0 & \cdots & -\frac{R_2}{L_2} & \frac{C_1+C_0}{C_2}\left(\frac{R_1}{L_1}-\frac{R_2}{L_2}\right) \\
0 & 0 & 0 & \cdots & 0 & -\frac{R_1}{L_1}-\frac{1}{R_0(C_1+C_0)}
\end{bmatrix} \tag{34}$$

$$B = \begin{bmatrix} 0 \\ B_1 \end{bmatrix}, \; B_1 = \begin{bmatrix} \frac{1}{C_n L_n} \\ 0 \\ \vdots \\ 0 \end{bmatrix}, \; C = [J \; 0], \; J = [0 \; \ldots \; 0 \; 1] \; \text{and} \; D = 0 \tag{35}$$

-continued $$n-1, a_{21}^{nn} = -\frac{1}{(C_1+C_0)L_1}\left(\frac{R_1}{R_0}+1\right), n \geq 2$$

Its super-diagonal entries have positive sign as $$a_{21}^{i,i+1} = \frac{1}{C_{n-i+1}L_{n-i}}, i=1,\ldots,n-2, \tag{37}$$

$$n > 2, a_{21}^{n-1,n} = \frac{1}{C_2 L_1} + \frac{1}{R_0 C_2}\left(\frac{R_1}{L_1} - \frac{R_2}{L_2}\right)$$

Its sub-diagonal entries have positive sign as $$a_{21}^{i,i-1} = \frac{1}{C_{n-i+1}L_{n-i+1}}, i=2,\ldots,n-1, \tag{38}$$

$$\text{and } a_{21}^{n,n-1} = \frac{1}{(C_1+C_0)L_1}, n \geq 2.$$

All other entries of matrix $A_{21}$ are 0.

The sub-matrix $A_{22}$ is an upper-triangle matrix. Its elements relate to the ratios of one resistor $R_i$ to its same section inductor $L_i$ and the ratios of one capacitor $C_i$ to another capacitor $C_j$. Its n-th row has elements $L_1$, $R_1$, $C_1$ and its load $R_0$ and $C_0$. The first row has elements $R_n+R_s$, $L_n$ and $L_{n-1}$. The ith-row has $R_{n-i+1}$, $R_{n-i}$, $L_{n-i+1}$, $L_{n-i}$ and $C_{n-i+1}$ for i=1,...,n-1. Its i-th column has $C_{n-i+1}$ for i=2,...,n. These characteristics reflect the structure of distributed interconnect and transmission line with its element index sequence.

The input matrix B has only one non-zero element in the (n+1)-th row $$b_{n+1} = \frac{1}{C_n L_n}. \tag{39}$$

The output matrix C has only one nonzero element 1 in the n-th column $$c_n = 1. \tag{40}$$

The direct output matrix D is 0. Therefore, it is clear that the computation complexity of this state space model is only $O(n^2)$ multiplications.

If the i-th node voltage is needed, the output matrix C can be set as C=[0 ... 1 ... 0] with its i-th entry as 1, i.e., $c_i=1$, and all others as 0, and the system matrix A, the input matrix B and the direct output matrix D are all the same as in (32–35) respectively. Thus, this state space model can check any node voltage by adjusting its corresponding output matrix C.

Equations (32–35) are a closed form of the exact space state model for the 2n-th order distributed interconnect and transmission line of Model 1 in FIG. 1, where n>>1 usual. However, it is also valid for any n>1. The corresponding method and algorithm are the above Method SS1 as shown in the above section.

For a special case n=1, the above model is reduced to the follows:

$$A_{21} = -\frac{R_0+R_1+R_s}{(C_1+C_0)L_1 R_0} = -\frac{1}{C_1 L_1} \cdot \frac{1+(R_1/R_0)+(R_s/R_0)}{1+C_0/C_1}, \tag{41}$$

$$A_{22} = -\frac{R_1+R_s}{L_1} - \frac{1}{(C_1+C_0)R_0}$$

$$B = \left[0 \frac{1}{(C_1+C_0)L_1}\right]^T, C = [1\ 0] \tag{42}$$

It usually relates to the model reduction with order two, while the distributed interconnect characters are captured by a very large order 2n.

A.2. Model 2—without Load and Source Parts:

FIG. 2 shows a preferred embodiment Model 2 that is the interconnect and transmission line itself, without any disturbance or distortion from various source and load parts. This case is particularly important since it describes the propagation delay characteristics of a distributed RLC line without any distortion of the load gate impedances and source impedances. Its state space model in an exact closed form is as follows $$A = \begin{bmatrix} 0 & I \\ A_{21} & A_{22} \end{bmatrix} \tag{43}$$

$$A_{21} = \begin{bmatrix} -\frac{1}{C_n}\left(\frac{1}{L_n}+\frac{1}{L_{n-1}}\right) & \frac{1}{C_n L_{n-1}} & 0 & \cdots & 0 & 0 & 0 \\ \frac{1}{C_{n-1}L_{n-1}} & -\frac{1}{C_{n-1}}\left(\frac{1}{L_{n-1}}+\frac{1}{L_{n-2}}\right) & \frac{1}{C_{n-1}L_{n-2}} & \cdots & 0 & 0 & 0 \\ 0 & \frac{1}{C_{n-2}L_{n-2}} & -\frac{1}{C_{n-2}}\left(\frac{1}{L_{n-2}}+\frac{1}{L_{n-3}}\right) & \cdots & 0 & 0 & 0 \\ \vdots & \vdots & \vdots & \ddots & \vdots & \vdots & \vdots \\ 0 & 0 & 0 & \cdots & -\frac{1}{C_3}\left(\frac{1}{L_3}+\frac{1}{L_2}\right) & \frac{1}{C_3 L_2} & 0 \\ 0 & 0 & 0 & \cdots & \frac{1}{C_2 L_2} & -\frac{1}{C_2}\left(\frac{1}{L_2}+\frac{1}{L_1}\right) & \frac{1}{C_2 L_1} \\ 0 & 0 & 0 & \cdots & 0 & \frac{1}{C_1 L_1} & -\frac{1}{C_1 L_1} \end{bmatrix} \tag{44}$$

-continued $$A_{22} = \begin{bmatrix} -\dfrac{R_n}{L_n} & \dfrac{C_{n-1}}{C_n}\left(\dfrac{R_{n-1}}{L_{n-1}} - \dfrac{R_n}{L_n}\right) & \dfrac{C_{n-2}}{C_n}\left(\dfrac{R_{n-1}}{L_{n-1}} - \dfrac{R_n}{L_n}\right) & \cdots & \dfrac{C_2}{C_n}\left(\dfrac{R_{n-1}}{L_{n-1}} - \dfrac{R_n}{L_n}\right) & \dfrac{C_1}{C_n}\left(\dfrac{R_{n-1}}{L_{n-1}} - \dfrac{R_n}{L_n}\right) \\ 0 & -\dfrac{R_{n-1}}{L_{n-1}} & \dfrac{C_{n-2}}{C_{n-1}}\left(\dfrac{R_{n-2}}{L_{n-2}} - \dfrac{R_{n-1}}{L_{n-1}}\right) & \cdots & \dfrac{C_2}{C_{n-1}}\left(\dfrac{R_{n-2}}{L_{n-2}} - \dfrac{R_{n-1}}{L_{n-1}}\right) & \dfrac{C_1}{C_{n-1}}\left(\dfrac{R_{n-2}}{L_{n-2}} - \dfrac{R_{n-1}}{L_{n-1}}\right) \\ 0 & 0 & -\dfrac{R_{n-2}}{L_{n-2}} & \cdots & \dfrac{C_2}{C_{n-2}}\left(\dfrac{R_{n-3}}{L_{n-3}} - \dfrac{R_{n-1}}{L_{n-2}}\right) & \dfrac{C_1}{C_{n-2}}\left(\dfrac{R_{n-3}}{L_{n-3}} - \dfrac{R_{n-2}}{L_{n-2}}\right) \\ \vdots & \vdots & \vdots & \ddots & \vdots & \vdots \\ 0 & 0 & 0 & \cdots & -\dfrac{R_2}{L_2} & \dfrac{C_1}{C_2}\left(\dfrac{R_1}{L_1} - \dfrac{R_2}{L_2}\right) \\ 0 & 0 & 0 & \cdots & 0 & -\dfrac{R_1}{L_1} \end{bmatrix}$$ (45)

$B = [0 \ldots 0 \vdots 1/(C_n L_n) 0 \ldots 0]^T$, $C = [0 \ldots 0 1 \vdots 0 \ldots 0]$ and $D = 0$, $n \geq 1$. (46)

If n=1, then its state space model is as $$A_{21} = -\dfrac{1}{C_1 L_1}, A_{22} = -\dfrac{R_1}{L_1}, B = \begin{bmatrix} 0 & \dfrac{1}{C_1 L_1} \end{bmatrix}^T, B_1 = \dfrac{1}{C_1 L_1},$$ (47)

$C = [1 \ 0], D = 0.$

Therefore, it is observed that the closed formula in (43–46) is also valid for n=1, if the lower right corner entry of matrices $A_{21}$ and $A_{22}$ respectively, the top entry of the second block matrix $B_1$ of matrix B, and the far right entry of the first block of matrix C are kept as the reduced form.

The method to get this model and calculation algorithm are similar to the one described above as follows.

Method SS2:
i) Set order 2n.
ii) Set the state matrix A as (43)
First Set $A_{11} = 0$, a $n \times n$ zero matrix; (48)

$A_{12} = I$, a $n \times n$ identity matrix; (49)

$A_{21}$ as (44), and (50)

$A_{22}$ as (45), then set (51)

$$A = \begin{bmatrix} A_{11} & A_{12} \\ A_{21} & A_{22} \end{bmatrix}$$ (52)

iii) Set the input matrix B, a 2n×1 column vector as (46)

(a) $b_i = 0$, $i = 1, \cdots, 2n$, then (b) $b_{n+1} = \dfrac{1}{C_n L_n}$ (53)

iv) Set the output matrix C, an 1×2n row vector as (a) $c_i = 0$, i=1, ..., 2n, then (b) $c_j = 1$, $j \in I[1,n]$; usually j=n, (54)

to select node n−j+1 as the output node for checking this node voltage.
v) Set the direct output scalar D=0.
vi) Stop Thus, the state space model {A,B,C,D} is established by the above said closed form (43–46) for Model 2.

A.3. Model 3—Even Distributed with Load and Source Parts:

FIG. 3 shows a preferred embodiment Model 3 that is the even distributed interconnect and transmission line with the source and load parts. Its state space model in an exact closed form is as follows:

$$A = \begin{bmatrix} 0 & I \\ A_{21} & A_{22} \end{bmatrix}$$ (55)

$$A_{21} = \begin{bmatrix} -\dfrac{2}{CL} & \dfrac{1}{CL} & 0 & \cdots & 0 & 0 & -\dfrac{R_s}{R_0 CL} \\ \dfrac{1}{CL} & -\dfrac{2}{CL} & \dfrac{1}{CL} & \cdots & 0 & 0 & 0 \\ 0 & \dfrac{1}{CL} & -\dfrac{2}{CL} & \cdots & 0 & 0 & 0 \\ \vdots & \vdots & \vdots & \ddots & \vdots & \vdots & \vdots \\ 0 & 0 & 0 & \cdots & -\dfrac{2}{CL} & \dfrac{1}{CL} & 0 \\ 0 & 0 & 0 & \cdots & \dfrac{1}{CL} & -\dfrac{2}{CL} & \dfrac{1}{CL} \\ 0 & 0 & 0 & \cdots & 0 & \dfrac{1}{(C+C_0)L} & -\dfrac{R+R_0}{R_0(C+C_0)L} \end{bmatrix},$$ (56)

$$A_{22} = \begin{bmatrix} -\dfrac{R+R_S}{L} & -\dfrac{R_S}{L} & -\dfrac{R_S}{L} & \cdots & -\dfrac{R_S}{L} & -\dfrac{R_S(C+C_0)}{LC} \\ 0 & -\dfrac{R}{L} & 0 & \cdots & 0 & 0 \\ 0 & 0 & -\dfrac{R}{L} & \cdots & 0 & 0 \\ \vdots & \vdots & \vdots & \ddots & \vdots & \vdots \\ 0 & 0 & 0 & \cdots & -\dfrac{R}{L} & 0 \\ 0 & 0 & 0 & \cdots & -\dfrac{R}{L} & -\dfrac{1}{R_0(C+C_0)} \end{bmatrix} \quad (57)$$

$$B = \begin{bmatrix} 0 & B_1 \end{bmatrix}^T = \begin{bmatrix} 0 & 0 & \cdots & 0 & \dfrac{1}{CL} & 0 & \cdots & 0 \end{bmatrix}^T, \; C = [\, 0 \; \cdots \; 0 \; 1 \; \vdots \; 0 \; \cdots \; 0\,] \quad (58)$$

and $D = 0, n > 1$.

For a special case n=1, the above model is reduced to the follows:

$$A_{21} = -\dfrac{R_0 + R + R_s}{(C+C_0)LR_0} = -\dfrac{1}{CL} \cdot \dfrac{1 + (R/R_0) + (R_s/R_0)}{1 + C_0/C}, \quad (59)$$

$$A_{22} = -\dfrac{R(1 + R_s/R)}{L} - \dfrac{1}{C(1 + C_0/C)R_0}$$

$$B = \begin{bmatrix} 0 & \dfrac{1}{CL(1 + C_0/C)} \end{bmatrix}^T, C = [\, 1 \; 0\,] \text{ and } D = 0. \quad (60)$$

This closed form shows that the affect of the source and load parts to Model 3 is by the ratios of $R_s/R$, $R/R_0$ and $C_0/C$. When they are small enough, then they can be dropped respectively. One extreme case is Model 4 without the source and load parts. Model 4 is a special case of Model 3 by dropping all these factors in the closed form formula.

It should be pointed out and emphasized that the above closed form involves only a constant times of multiplications and divisions for any large order n (n>>1). This means that its computation complexity is fixed and less than O(n), and that is O(1)!

The method to get this model and calculation algorithm is similar to the one described above as follows.

Method SS3:
i) Set order 2n.
ii) Set the state matrix A as (55)
   If n=1, then set $A_{21}$ as (59), and (61)

$A_{22}$ as (59), then set (62)

$$A = \begin{bmatrix} 0 & 1 \\ A_{21} & A_{22} \end{bmatrix}, \text{ then set} \quad (63)$$

$$B = \begin{bmatrix} 0 & \dfrac{1}{CL(1 + C_0/C)} \end{bmatrix}^T, C = [\,1\; 0\,] \text{ and } D = 0 \quad (64)$$

Stop
   If n>1, go to the next step.
iii) First set $A_{11}=0$, a $n \times n$ zero matrix; (65)

$A_{12}=I$, a $n \times n$ identity matrix; (66)

$A_{21}$ as (56), and (67)

$A_{22}$ as (57), then set (68)

$$A = \begin{bmatrix} A_{11} & A_{12} \\ A_{21} & A_{22} \end{bmatrix} \quad (69)$$

iv) Set the input matrix B, a $2n \times 1$ column vector as (58)

(a) $b_i = 0$, $i = 1, \cdots, 2n$, then (b) $b_{n+1} = \dfrac{1}{CL}$ (70)

v) Set the output matrix C, an $1 \times 2n$ row vector as (a) $c_i=0$, i=1, . . . ,2n, then (b) $c_j=1$, $j \in I[l,n]$; usually j=n, (71)

to select node n−j+1 as the output node for checking this node voltage.

vii) Set the direct output scalar D=0.
viii) Stop.

Thus, the state space model {A,B,C,D} is established by the above said closed form (55–58) for Model 3.

A.4. Model 4—Even Distributed without Load and Source Parts:

FIG. 4 shows a preferred embodiment Model 4 that is the even distributed interconnect and transmission line itself, without the source and load parts. Thus it is without any disturbance or distortion from various source and load parts. Its state space model in an exact closed form is as follows $$A = \begin{bmatrix} 0 & I \\ A_{21} & A_{22} \end{bmatrix} \quad (72)$$

$$A_{21} = \begin{bmatrix} -\frac{2}{CL} & \frac{1}{CL} & 0 & \cdots & 0 & 0 & 0 \\ \frac{1}{CL} & -\frac{2}{CL} & \frac{1}{CL} & \cdots & 0 & 0 & 0 \\ 0 & \frac{1}{CL} & -\frac{2}{CL} & \cdots & 0 & 0 & 0 \\ \vdots & \vdots & \vdots & \ddots & \vdots & \vdots & \vdots \\ 0 & 0 & 0 & \cdots & -\frac{2}{CL} & \frac{1}{CL} & 0 \\ 0 & 0 & 0 & \cdots & \frac{1}{CL} & -\frac{2}{CL} & \frac{1}{CL} \\ 0 & 0 & 0 & \cdots & 0 & \frac{1}{CL} & -\frac{1}{CL} \end{bmatrix} =$$

$$\frac{1}{CL}\begin{bmatrix} -2 & 1 & 0 & \cdots & 0 & 0 & 0 \\ 1 & -2 & 1 & \cdots & 0 & 0 & 0 \\ 0 & 1 & -2 & \cdots & 0 & 0 & 0 \\ \vdots & \vdots & \vdots & \ddots & \vdots & \vdots & \vdots \\ 0 & 0 & 0 & \cdots & -2 & 1 & 0 \\ 0 & 0 & 0 & \cdots & 1 & -2 & 1 \\ 0 & 0 & 0 & \cdots & 0 & 1 & -1 \end{bmatrix} \quad (73)$$

$$A_{22} = \begin{bmatrix} -\frac{R}{L} & 0 & 0 & \cdots & 0 & 0 \\ 0 & -\frac{R}{L} & 0 & \cdots & 0 & 0 \\ 0 & 0 & -\frac{R}{L} & \cdots & 0 & 0 \\ \vdots & \vdots & \vdots & \ddots & \vdots & \vdots \\ 0 & 0 & 0 & \cdots & -\frac{R}{L} & 0 \\ 0 & 0 & 0 & \cdots & 0 & -\frac{R}{L} \end{bmatrix} = -\frac{R}{L} \cdot I_{n \times n} \quad (74)$$

$$B = \begin{bmatrix} 0 & B_1 \end{bmatrix}^T = \begin{bmatrix} 0 & 0 & \cdots & 0 & \frac{1}{CL} & 0 & \cdots & 0 \end{bmatrix}^T, C = \begin{bmatrix} 0 & \cdots & 0 & 1 & \vdots & 0 & \cdots & 0 \end{bmatrix} \text{ and} \quad (75)$$

$$D = 0, n \geq 1.$$

For a special case n=1, the above model is reduced to the follows:

$$A_{21} = -\frac{1}{CL}, A_{22} = -\frac{R}{L}, B = \begin{bmatrix} 0 & \frac{1}{CL} \end{bmatrix}^T, C = \begin{bmatrix} 1 & 0 \end{bmatrix} \text{ and} \quad (76)$$

$$D = 0.$$

It means that the above closed form (72–75) is valid for n=1.

It should be pointed out and emphasized that the above closed form involves only two times of multiplications and two times of division for any large order n (n>>1). This means that its computation complexity is a constant 4, i.e., O(1)!

The method to get this model and calculation algorithm are similar to the one described above as follows.

Method SS4:
i) Set order 2n.
ii) Set the state matrix A as (72)

If n=1, then set $$A_{21} = -\frac{1}{CL} \text{ as (76), and} \quad (77)$$

$$A_{22} = -\frac{R}{L} \text{ as (76), then set} \quad (78)$$

$$A = \begin{bmatrix} 0 & 1 \\ A_{21} & A_{22} \end{bmatrix}, \text{ then set} \quad (79)$$

$$B = \begin{bmatrix} 0 & \frac{1}{CL} \end{bmatrix}^T, C = \begin{bmatrix} 1 & 0 \end{bmatrix} \text{ and } D = 0 \text{ as (76)} \quad (80)$$

Stop
If n>1, go to the next step.
iii) First set $A_{11} = 0$, a $n \times n$ zero matrix; \quad (81)

$A_{12} = I$, a $n \times n$ identity matrix; \quad (82)

$A_{21}$ as (73), and \quad (83)

$A_{22}$ as (74), then set $$A = \begin{bmatrix} A_{11} & A_{12} \\ A_{21} & A_{22} \end{bmatrix} \quad (85)$$

iv) Set the input matrix B, a 2n×1 column vector as (75)

(a) $b_i = 0$, $i = 1, \cdots, 2n$, then (b) $b_{n+1} = \dfrac{1}{CL}$ (86)

v) Set the output matrix C, an 1×2n row vector as (a) $c_i=0$, $i=1, \ldots, 2n$, then (b) $c_j=1$, $j \in I[l,n]$; usually $j=n$, (87)

to select node n−j+1 as the output node for checking this node voltage.

vi) Set the direct output scalar D=0.

vii) Stop.

Thus, the state space model {A,B,C,D} is established by the above said closed form (72–75) for Model 4.

B. Calculating the Transfer Functions Recursively

It is illustrated in this subsection how to recursively calculate the transfer function at the output node of an RLC interconnect and transmission line using the concepts developed in the previous subsection. Consider the general RLC distributed interconnect and transmission line in FIGS. 1–4.

B.1. Model 1—with its Source and Load Parts

FIG. 1 shows Model 1 of the distributed RLC interconnect and transmission line. The transfer function is obtained by the above described recursive algorithm. Here a preferred embodiment is simplified from that. The method to obtain the transfer function model $T_n(s)$ in (18)–(22), where 2n is the order of the circuit system, from the input $v_{in}(t)$ to the output $v_o(t)$ is in the following recursive algorithm (a detail form).

Method TF1-1:

(i) Input all data: $n$; $R_i$, $i=1, \ldots, n$; $C_i$, $i=1, \ldots, n$; $L_i$, $i=1, \ldots, n$; $R_s$; $1/R_0$; $C_0$; (88)

(ii) Set new $R_n = R_n + R_s$, $C_1 = C_1 + C_0$; (89)

(iii) Set the numerator of the transfer function as $N_n(s) = 1$; (90)

(iv) Set the recursive initiate values $D_1(s) = s(L_1 s + R_1) C_1 + 1 + \dfrac{L_1 s + R_1}{R_0}$ and $\Delta_1 = C_1 s + \dfrac{1}{R_0}$; (91)

(v) If $n = 1$, then (92)

$T_1(s) = \dfrac{N_1(s)}{D_1(s)}$

Stop

If $n > 1$, go to the next step.

(vi) If $n > 1$, then for $j = 2, \ldots, n$ $\Delta_j = sC_j D_{j-1}(s) + \Delta_{j-1}$ (93)

$D_j(s) = (L_j s + R_j)\Delta_j + D_{j-1}(s)$ (94)

end (vii) Thus, the transfer function model is $T_n(s) = \dfrac{N_n(s)}{D_n(s)}$. (95)

B.2. Model 2—without Load and Source Parts:

FIG. 2 shows a preferred embodiment Model 2 that is the RLC interconnect and transmission line itself, without any disturbance or distortion from various source and load parts. The method to get the transfer function is as follows via the previous recursive method TF1-1.

This case (Model 2) in FIG. 2 can be viewed as a special case of Model 1 in FIG. 1 by setting the source resistor and load capacitor to be zero and the load resistor to be infinite as $R_s=0$, $C_0=0$, and $1/R_0=0$ in step (i). (96)

Then apply the recursive algorithm TF1-1 in (88)–(95). This makes Method TF2-1.

Another way is to set a new simple step (i) instead of steps (i) and (ii) in the above, making a new algorithm as follows.

Method TF2-2:

(i) Input all data: $n$; $R_i$, $i=1, \ldots n$; $C_i$, $i=1, \ldots n$; and $L_i$, $i=1, \ldots, n$; (97)

(ii) Set the numerator of the transfer function as $N_n(s)=1$; (98)

(iii) Set the recursive initiate values $D_1(s) = s(L_1 s + R_1)C_1 + 1$ and $\Delta_1 = C_1 s$; (99)

(iv) If n=1, then $T_1(s) = \dfrac{N_1(s)}{D_1(s)}$ (100)

Stop

If n>1, go to the next step.

(v) If n>1, then for j=2, . . . ,n $\Delta_j = sC_j D_{j-1}(s) + \Delta_{j-1}$ (101)

$D_j(s) = (L_j s + R_j)\Delta_j + D_{j-1}(s)$ (102)

end (vi) Thus, the transfer function model is $T_n(s) = \dfrac{N_n(s)}{D_n(s)}$. (103)

B.3. Model 3—Even Distributed with Load and Source Parts:

FIG. 3 shows a preferred embodiment Model 3 that is the even distributed interconnect and transmission line with the source and load parts. The ways to get its transfer function model can be several following methods:

Method TF3-1 is exactly the same to Method TF1-1 just with $R_i=R$, $C_i=C$, and $L_i=L$, $i=1, \ldots, n$.

Method TF3-2:

(i) Input all data: n, R, $R_s$, $1/R_0$, $C_0$, C and L; (104)

(ii) Set the numerator of the transfer function as $N_n(s)=1$; (105)

(iii) If n=1, then $$T_1(s) = \frac{N_1(s)}{D_1(s)} = \frac{1}{D_1(s)}, \qquad (106)$$

$$D_1(s) = s(Ls + R + R_s)(C + C_0) + 1 + \frac{Ls + R + R_s}{R_0}$$

Stop
If n>1, go to the next step.
(iv) Set the recursive initiate values $$D_1(s) = s(Ls+R)(C+C_0) + 1 + \frac{Ls+R}{R_0} \text{ and } \Delta_1 = (C+C_0)s + \frac{1}{R_0} \quad (107)$$

(v) If n=2, go to Step (vii). If n>2, go to the next step.
(vi) If n>2, then for j=2, ... ,n−1

$$\Delta_j = sCD_{j-1}(s) + \Delta_{j-1} \qquad (108)$$

$$D_j(s) = (L_s+R)\Delta_j + D_{j-1}(s) \qquad (109)$$

end (vii) Set $\Delta_n = sCD_{n-1}(s) + \Delta_{n-1}$ (110)

(viii) Set $D_n(s) = (Ls+R+R_s)\Delta_n + D_{n-1}(s)$ (111)

(ix) Thus, the transfer function model is $T_n(s) = \frac{N_n(s)}{D_n(s)}$. (112)

B.4. Model 4—Even Distributed without Load and Source Parts:

FIG. 4 shows a preferred embodiment Model 4 that is the even distributed interconnect and transmission line itself, without the source and load parts. Thus it is without any disturbance or distortion from various source and load parts. The recursive way to generate the transfer function of this model is $$T_n(s) = \frac{N_n(s)}{D_n(s)}, N_n(s) = 1, \Delta_j = sCD_{j-1}(s) + \Delta_{j-1}, \quad (113)$$

$$D_j(s) = (Ls+R)\Delta_j + D_{j-1}(s), j = 2, \ldots, n$$

with initial values $$D_1(s) = s(Ls+R)C+1 \text{ and } \Delta_1 = Cs. \qquad (114)$$

Its transfer function model can be obtained via the following recursive methods.

Method TF4-1: Using Method TF1-1 by setting $R_s=0$, $C_0=0$, $1/R_0=0$, $R_i=R$, $C_i=C$, and $L_i=L$, $i=1, \ldots ,n$.

Method TF4-2: Using Method TF3-2 by setting $R_s=0$, $C_0=0$, and $1/R_0=0$.

Method TF4-3:
(i) Input all data: n, R, L and C;
(ii) Set the numerator of the transfer function as $$N_n(s) = 1; \qquad (115)$$

(iii) Set initiate values $$D_1(s) = s(Ls+R)C+1 \text{ and } \Delta_1 = Cs; \qquad (116)$$

(iv) If n>1, for j=2, ... ,n $$\Delta_j = sCD_{j-1}(s) + \Delta_{j-1} \qquad (117)$$

$$D_j(s) = (Ls+R)\Delta_j + D_{j-1}(s) \qquad (118)$$

end (v) Thus, the transfer function model is $T_n(s) = \frac{N_n(s)}{D_n(s)}$. (119)

C. Model Reduction and Approximation Order

It has been shown how to calculate the exact state space model via the above accurate closed-forms and the exact transfer functions via the recursive methods and algorithms. However, calculating these exact model with the order of thousands for typical large distributed interconnect and transmission line. In practice, there is no need to calculate the so high order model of RLC interconnect and transmission line, since the transient behavior can be accurately characterized by low order model, e.g., by a small number of dominant poles (typically several tens of poles). Now the above state models and transfer function models provide a basis and a starting point for model reduction or model truncation and further comparison. For example, the Balanced Truncation Method (BTM) can be applied to the above state space models for model reduction. The obtained transfer function models can be used for model reduction methods via frequency domain such as AWE, Padé approximation and other related methods. By comparison to the original model, the approximation order of the reduced model can be determined by the approximation performance requirements, such as accuracy and frequency range.

It is very powerful to reveal the relationship among the ELO reduction models and its original high order model. The method and relationship is as follows.

Consider a 2n-th even distributed RLC interconnect circuit shown in FIG. 4 with its "total" length resistor $R_t$, "total" capacitor $C_t$ and "total" inductor $L_t$ in (31). Thus, its original $2n^{th}$-order even distributed model is in (72)–(76). Its 2m-th ELO model $\{A_{em}, B_{em}, C_{em}, D\}$ is $$A_{em}\begin{bmatrix} 0 & I \\ A_{em21} & A_{em22} \end{bmatrix} \qquad (120)$$

$$A_{em21} = \frac{1}{r^2CL}\begin{bmatrix} -2 & 1 & 0 & \cdots & 0 & 0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & 1 & -1 \end{bmatrix}, A_{em22} = -\frac{R}{L} \cdot I_{m \times m} \qquad (121)$$

$$B_{em} = [0 \ B_{em1}]^T = \frac{1}{r^2CL}[0 \ 0 \ \cdots \ 0 \ 1 \ 0 \ \cdots \ 0]^T, \qquad (122)$$

$$C_{em} = [0 \cdots 0 \ 1 \ \vdots \ 0 \cdots 0], D = 0, n \geq 1$$

where $A_{em} \in R^{2m \times 2m}$, $A_{em21} \in R^{m \times m}$, $A_{em22} \in R^{m \times m}$, $B_{em} \in R^{2m \times 1}$, $C_{em} \in R^{1 \times 2m}$, parameters R, C and L are the parameters of the original 2n-th model, and the order reduction ratio is $$r = n/m. \qquad (123)$$

Its transfer function is $$T_{em}(s) = \frac{N_{em}(s)}{D_{em}(s)}, N_{em}(s) = 1, \quad (124)$$

$$\Delta_{e,j} = srCD_{e,j-1}(s) + \Delta_{e,j-1}, \quad (125)$$
$$D_{e,j}(s) = r(Ls+R)\Delta_{e,j} + D_{e,j-1}(s), j = 2, \ldots, m,$$

with its initial values $$D_{e1}(s) = r^2 s(Ls+R)C + 1 \text{ and } \Delta_{e1} = rCs. \quad (126)$$

When m=1, the algorithm goes with r=n to $$N_{e1}(s) = 1, D_{e1}(s) = \quad (127)$$
$$n^2 s (Ls+R) C + 1 \text{ and } T_{e1}(s) = \frac{1}{n^2 LCs^2 + n^2 RCs + 1}.$$

The method can be extended to the even-distributed RLC interconnect circuit with the source and load parts as shown in FIG. 3. Thus, its original $2n^{th}$-order even distributed model is in (55)–(58). Then, its 2m-th reduced order ELO state space model $\{A_{em}, B_{em}, C_{em}, D\}$ is:

$$A_{em} = \begin{bmatrix} 0 & I \\ A_{em21} & A_{em22} \end{bmatrix} \quad (128)$$

$$A_{em21} = \frac{1}{r^2 CL} \begin{bmatrix} -2 & 1 & 0 & \cdots & 0 & -R_s/R_0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & \frac{1}{1+(C_0/rC)} & -\frac{1+(rR/R_0)}{1+(C_0/rC)} \end{bmatrix}, \quad (129)$$

$$A_{em22} = -\frac{R}{L} \begin{bmatrix} 1+\frac{R_s}{rR} & \frac{R_s}{rR} & \frac{R_s}{rR} & \cdots & \frac{R_s}{rR} & \frac{R_s}{rR}\left(1+\frac{C_0}{rC}\right) \\ 0 & 1 & 0 & \cdots & 0 & 0 \\ 0 & 0 & 1 & \cdots & 0 & 0 \\ \vdots & \vdots & \vdots & \ddots & \vdots & \vdots \\ 0 & 0 & 0 & \cdots & 1 & 0 \\ 0 & 0 & 0 & \cdots & 0 & 1+\frac{L}{rRR_0 C(1+C_0/rC)} \end{bmatrix} \quad (130)$$

$$B_{em} = [0 \; B_{em1}]^T = \frac{1}{r^2 CL} \quad (131)$$
$$[0 \; 0 \; \cdots \; 0 \; 1 \; 0 \; \cdots \; 0]^T, C_{em} = [0 \cdots 0 \; 1 \vdots 0 \cdots 0], D = 0, n > 1$$

where $A_{em} \in R^{2m \times 2m}$, $A_{em21} \in R^{m \times m}$, $A_{em22} \in R^{m \times m}$, $B_{em} \in R^{2m \times 1}$, $C_{em} \in R^{1 \times 2m}$, parameters R, C and L are the parameters of the original 2n-th model, and the order reduction ratio is r=n/m.

Its transfer functions is $$T_{em}(s) = \frac{N_{em}(s)}{D_{em}(s)},$$

with $N_{em}(s)=1$. $D_{em}(s)$ is from the recursive algorithm. If m>1, set the initial values $$D_{e,1}(s) = r^2 Cs(Ls+R)(1+C_0/rC) + 1 + r \cdot \frac{Ls+R}{R_0} \text{ and} \quad (132)$$

$$\Delta_{e,1} = rC(1+C_0/rC)s + \frac{1}{R_0}$$

For j=2, . . . m−1, take the recursive algorithm as $$\Delta_{e,j} = srCD_{e,j-1}(s) + \Delta_{e,j-1}, D_{e,j}(s) = r(Ls+R)\Delta_{e,j} + D_{e,j-1}(s) \quad (133)$$

Finally, set $\Delta_{e,m} = srCD_{e,m-1}(s) + \Delta_{e,m-1}$, $D_{em}(s) = r(Ls+R+R_s/r)\Delta_{em} + D_{e,m-1}(s)$ \quad (134)

Then, it leads to $$T_{em}(s) = \frac{1}{D_{em}(s)}.$$

When m=1, it leads to r=n, $$T_{e1}(s) = \frac{1}{D_{e1}(s)} \text{ and } D_{e,1}(s) = \quad (135)$$
$$n^2 Cs(Ls+R+R_s/n)(1+C_0+/nC) + 1 + n \cdot \frac{Ls+R+R_s/n}{R_0}$$

The above method shows that the ELO model with the source and load parts depends on its parameter ratios $R/R_s$, $R/R_0$, $C/C_0$, $(R_t/R_s, R_t/R_0, C_t/C_0)$ and order reduction ratio r between its distribution parameters and external parameters respectively. There are two extreme situations for external parameters: one is interconnect itself without any distortion, and another one is with large external parameters. A regular case will be between these extreme cases. However, the reduced model for the interconnect itself can connect to various external source and load data.

D. Determining the Transient Response and the Bode Plots

Further, the above original models and their reduced order models can be used to determine and investigate their transient responses and Bode plots, i.e., their time domain performance and frequency domain performance, respectively. For example, some simple MATLAB command step (A,B,C,D) or step(n,d) for the step response, and bode(n,d) or bode(A,B,C,D) for Bode plot in frequency domain. These performance graphs and data can facilitate comparison of the original model and its reduced order model.

E. Complexity and Stability Characteristics

The methods just disclosed here have a computation complexity of $O(n^2)$ for the general state space models, where n is the number of RLC sections in the interconnect and transmission line, its order is 2n, and a computation complexity of $O((n-1)^2) \approx O(n^2)$ for transfer function model, which is less than the traditional method complexity $O(n^k)$ with k>2 or k>3. This complexity of $O(n^2)$ results because the state space model methods avoid matrix inverse and matrix multiplication operations. That complexity of $O((n-1)^2)$ results because the transfer function model methods apply recursive algorithms, which involve only simple multiplications.

However, for evenly distributed RLC interconnect and transmission line, the said closed form of state space model has its computation complexity of only a fixed constant, i.e., $O(1)$. It is usually true that interconnect and transmission line, tree and net consist of evenly distributed sub-interconnect and sub-transmission lines. Thus, the computation complexity of the new methods disclosed here for their state space models are the product of their sub-piece number times O(1), that is much less than O(n).

These methods result the exact accurate models for the 2n-th order distributed RLC interconnect and transmission line system. Therefore, these methods guarantee the derived models stability, and are also numerically stable for any order of the model. The methods also can be combined with scaling and other techniques.

The present method is specifically efficient to model the distributed nature of the interconnect impedance because of its so simple calculation in the state space models and so easy recursive algorithms in the transfer function models, in addition to its high accuracy.

F. Experimental Results

The said closed-form in the state space model is much useful for time domain simulation, especially the step response that is commonly used in test and evaluation. If a system is described in transfer function, it is first converted to state space in time-domain when a step response is required. However, the transfer function is much useful for the frequency domain simulation and evaluation, especially the Bode plot that is commonly used in evaluation and analysis in frequency domain. If a system is described in a state space model, it is first converted to transfer function in frequency domain when a Bode plot is required.

The presented said methods will now be applied to calculate the transient response of step response and the Bode plots of frequency response of two evenly distributed RLC interconnect and transmission lines. Two cases are considered here as examples. Case 1 is an interconnect and transmission line itself without its source and load parts, while Case 2 is this interconnect and transmission line with its source and load parts. The resulting exact models are further used to derive the BTM reduced models and ELO reduced models. Then, the resulting step responses and Bode plots of the original models are compared to the corresponding step responses and Bode plots of their BTM and ELO reduced order models, respectively.

Case 1. Consider an even distributed RLC interconnect Model 4 of 0.01 cm long with distribution characteristic data of resistor 5.5 kΩ/m and capacitor 94.2 pF/m. An $200^{th}$-order model is used as its original model with R=$5.5 \cdot 10^{-3}$ Ω and C=$9.42 \cdot 10^{-5}$ pF, while the inductor value L is calculated from the light speed in the material and the capacitor value C as L=$2.831 \times 10^{-13}$ H.

Case 2. Consider the same even distributed RLC interconnect in Case 1, but with a source resistor $R_s$=500Ω, a load resistor $R_o$=1MΩ, and a load capacitor $C_o$=1 pF in Model 3. Here, these external parameters data are dominate, comparing with the distributed parameter data of R and C.

Case 1.A. By applying the Method SS4 for Model 4 to Case 1, the 200-th order original model S={A,B,C,D} is:

$$A_{21} = 3.7511 \cdot 10^{28} \begin{bmatrix} -2 & 1 & 0 & \cdots & 0 & 0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & 1 & -1 \end{bmatrix},$$

-continued $$A_{22} = -1.9435 \cdot 10^{10} \cdot I_{100 \times 100}, A = \begin{bmatrix} 0 & I \\ A_{21} & A_{22} \end{bmatrix},$$

$$B = [0 \ B_1]^T = [0 \ 0 \ \cdots \ 0 \ 3.7511 \cdot 10^{28} \ 0 \ \cdots \ 0]^T,$$

$$C = [0 \cdots 0 \ 1 \ \vdots \ 0 \cdots 0] \text{ and } D = 0.$$

The recursive algorithm can calculate the transfer function easily. Due to the tiny distributed parameter data, scaling technique can be used to facilitate the simulations.

FIG. 5 shows the step response of this original 200th order model by the said closed form of the state space model.

FIG. 6 shows the Bode plot of this original 200th order model by the said recursive algorithm of the transfer function.

The Bode plot can be executed from either the state space model or its transfer function model obtained by the recursive algorithm described above or the MATLAB command ss2tf However, the results from the recursive algorithm are more accurate than those from the other methods. The original model show an increasing level suppression as the frequency increases in the very high frequency range. However, the reduced order models can not follow this property when the frequency above a certain frequency.

Case 1.B. Experiment data include a $200^{th}$ original model in Case 1 and its ELO reduced models as follows. The ELO reduced model is just a 2m-th order model in Model 4 with R, L and C proportional to its piece length. The ELO models are obtained by using the said methods disclosed above.

FIG. 7 shows the step responses of the original model and its second order ELO model (n=1) by the said closed form of the state space model.

FIG. 8 shows the Bode plots of the original model and its second order ELO model (n=1) by the said recursive algorithm of the transfer function.

FIG. 9 shows the step responses of the original model and its fourth order ELO model (n=2) by the said closed form of the state space model.

FIG. 10 shows the Bode plots of the original model and its fourth order ELO model (n=2) by the said recursive algorithm of the transfer function.

FIG. 11 shows the step responses of the original model and its 20-th order ELO model (n=10) by the said closed form of the state space model.

FIG. 12 shows the Bode plots of the original model and its 20-th order ELO model (n=10) by the said recursive algorithm of the transfer function.

These simulations demonstrate that the regular low order ELO model reduction may not represent its original distributed interconnect and transmission line well.

Therefore, it is observed that a higher order ELO model is required for a sufficiently good approximation to the original $200^{th}$-order model from the time domain responses. It is obvious and natural that the higher the ELO model order is, the better its approximation is.

Case 2.A. By applying the methods for Model 3 to Case 2, its original $200^{th}$ order model S is:

$$A_{21} = 3.7511 \cdot 10^{28} \begin{bmatrix} -2 & 1 & 0 & \cdots & 0 & 0 & -5 \cdot 10^{-4} \\ 1 & -2 & 1 & \cdots & 0 & 0 & 0 \\ 0 & 1 & -2 & \cdots & 0 & 0 & 0 \\ \vdots & \vdots & \vdots & \ddots & \vdots & \vdots & \vdots \\ 0 & 0 & 0 & \cdots & -2 & 1 & 0 \\ 0 & 0 & 0 & \cdots & 1 & -2 & 1 \\ 0 & 0 & 0 & \cdots & 0 & 9.4191 \cdot 10^{-5} & -9.4191 \cdot 10^{-5} \end{bmatrix},$$

$$A_{22} = -1.9435 \cdot 10^{10} \begin{bmatrix} 9.091 \cdot 10^4 & 9.0909 \cdot 10^4 & 9.0909 \cdot 10^4 & \cdots & 9.0909 \cdot 10^4 & 9.6516 \cdot 10^8 \\ 0 & 1 & 0 & \cdots & 0 & 0 \\ 0 & 0 & 1 & \cdots & 0 & 0 \\ \vdots & \vdots & \vdots & \ddots & \vdots & \vdots \\ 0 & 0 & 0 & \cdots & 1 & 0 \\ 0 & 0 & 0 & \cdots & 0 & 5.1450 \cdot 10^{-5} \end{bmatrix}$$

$$A = \begin{bmatrix} 0 & I \\ A_{21} & A_{22} \end{bmatrix}, B = [0 \ B_1]^T = [0 \ 0 \ \cdots \ 0 \ 3.7511 \cdot 10^{28} \ 0 \ \cdots \ 0]^T, C = [0 \ \cdots \ 0 \ 1 \ \vdots \ 0 \ \cdots \ 0]$$

FIG. 13 shows the step response of the above original model (Model 3) but $C_0=0$ by the said closed form of the state model.

FIG. 14 shows the Bode plot of the above original model (Model 3) but $C_0=0$ by the said recursive algorithm of the transfer function.

Case 2.B Consider the same even distributed RLC interconnect as in Case 2.A but $C_0=0$, its original $200^{th}$ order model, and its BTM reduction models obtained by using the methods in Sections A.3 and B.3.

FIG. 15 shows the step responses of the original model and the BTM models of orders 1 and 2.

FIG. 16 shows the Bode plots of the above original model (Model 3) and the BTM models of order 1 and 10 by the said recursive algorithm of the transfer function The differences among the reduction models are obvious. The said new methods and techniques are very useful and effective for modeling and various model reductions as well as comparison.

It is found that the methods disclosed here are useful, stable and accuracy; on the other hand they are also easy, simply and effective for use with low computation complexity and less time-cost.

What I claim as my invention is:

1. A method for establishing a time-domain state space model of an RLC interconnect or transmission line for simulation, or performance analysis, or model reduction, or circuit design, including the steps of
    (a) setting a model order (an even number) for the state space model, denoted as 2n;
    (b) forming the RLC interconnect or transmission line as n sections in series from a source input terminal down to a final sink terminal with said source input terminal and n nodes, where n−1 nodes are conjunction nodes between neighbor sections, and one end node is the final sink terminal, said n sections have an section index, say i, and each section i has elements comprising a resistor $R_i$, an inductor $L_i$ and a capacitor $C_i$, its resistor $R_i$ and inductor $L_i$ are in series and connect to two nodes of section i, its capacitor $C_i$ connects to its downward node i of section i and a ground;
    (c) assigning a set of distributed resistances, distributed inductances and distributed capacitances for said n sections, as said $R_i$, said $L_i$, and said $C_i$ for each section i respectively, and having an output port at one of said nodes with a voltage driven by a source voltage input to the source input terminal;
    (d) taking the voltages of said n nodes and their derivatives as a state variable vector of said time-domain model, the source voltage as an input variable, and the output port voltage as an output variable;
    (e) building a 2n×2n system matrix A with four n×n sub-matrices as $A_{11}$, $A_{12}$, $A_{21}$, and $A_{22}$ as $$A = \begin{bmatrix} A_{11} & A_{12} \\ A_{21} & A_{22} \end{bmatrix},$$

where the sub-matrix $A_{11}$ is set as a 0-matrix, the sub-matrix $A_{12}$ is set as an identity matrix I, the entries of the diagonal line, super-diagonal line and sub-diagonal line of the sub-matrix $A_{21}$ are formulated respectively from members of the distributed inductors and capacitors, the sub-matrix $A_{22}$ is set as a triangle matrix with its non-zero entries being formulated respectively from members of the distributed resistors, inductors and capacitors;
    (f) building a 2n×1 input matrix B with a non-zero entry formulated from the distributed inductor and capacitor of the section which is directly connected to the source;
    (g) building an output matrix C with an 1×2n row having only one non-zero entry at one of its first n entries for selecting said output port node voltage;
    (h) building a zero direct output matrix D;
    (i) forming the time-domain state space model {A,B,C,D} by said four matrices A, B, C and D;

whereby the state variable vector of the time-domain state space model follows a differential equation called a system equation $\dot{x}(t)= Ax(t)+Bu(t)$, the output variable follows an algebraic equation called an output equation $y(t)=Cx(t)+Du(t)$, where $x(t)$ denotes the state variable vector, $u(t)$ denotes the source voltage, and $y(t)$ denotes an output vector including the output port voltage, said method provides a closed form for establishing the time-domain state space model of the interconnect or transmission line without any calculation of matrix inverse, matrix decomposition and matrix multiplication, thus the method significantly reduces its computation complexity not only for modeling but also for further simulation, model reduction, verification, performance analysis, or circuit design.

2. The method of claim 1, further including the following step of executing simulation or model reduction on the state space model $\{A,B,C,D\}$ for performance analysis, or circuit design involving the RLC interconnect or transmission line.

3. The method of claim 1, wherein
 (a) said section index i together with the resistor $R_i$, inductor $L_i$ and capacitor $C_i$ is arranged in a sequence, say upward from the final sink to the source by 1 through n, i=1, . . . ,n;
 (b) said state variable vector has its entries of said node voltages in a sequence, say from the node next to the source input terminal to the final sink terminal node, and its entries of said node voltage derivatives in the same sequence;
 (c) said sub-matrix $A_{21}$ of the system matrix is in a form as an n×n matrix (d) said input matrix B is in a form as $B=[0 \ldots 0 \vdots 1/(C_n L_n) \; 0 \ldots 0]^T$;
 (e) said non-zero entry in the 1×2n row of the output matrix C is 1 at its (n+1−k)-th entry from the left for its k-th node voltage output, $1 \leq k \leq n$, e.g., $C=[0 \ldots 0 \; 1 \vdots 0 \ldots 0]$ for an output of the final sink node 1.

4. The method of claim 3, further including a known similarity transformation by a non-singular matrix T on the model $\{A, B, C, D\}$, that updates $\{A, B, C, D\}$ by $\{T^{-1}AT, T^{-1}B, CT, D\}$, with a transformed state variable vector $Tx(t)$ and an output of a member of the transformed state variable vector of the interconnect or transmission line.

5. The method of claim 1, further including the following steps of
 (a) forming a source resistor with a resistance $R_s$ connected to a source signal and said source input terminal, and a load capacitor with a capacitance $C_0$ and a load resistor with a resistance $R_0$ in parallel connected to said final sink terminal and the ground based on the connection data;
 (b) setting said sub-matrix $A_{21}$ with one column entries formulated from the load resistor $R_0$ and members of the distributed capacitors, resistors and inductors, where one entry formulation further includes the source resistor $R_s$, and another entry formulation further includes the load capacitor $C_0$, and one entry in the one off-diagonal line formulated from the load capacitor $C_0$ and a distributed inductor;

$$A_{21} = \begin{bmatrix} -\frac{1}{C_n}\left(\frac{1}{L_n}+\frac{1}{L_{n-1}}\right) & \frac{1}{C_n L_{n-1}} & 0 & \cdots & 0 & 0 & 0 \\ \frac{1}{C_{n-1}L_{n-1}} & -\frac{1}{C_{n-1}}\left(\frac{1}{L_{n-1}}+\frac{1}{L_{n-2}}\right) & \frac{1}{C_{n-1}L_{n-2}} & \ddots & 0 & 0 & 0 \\ 0 & \frac{1}{C_{n-2}L_{n-2}} & -\frac{1}{C_{n-2}}\left(\frac{1}{L_{n-2}}+\frac{1}{L_{n-3}}\right) & \ddots & \ddots & 0 & 0 \\ \vdots & \vdots & \ddots & \ddots & \ddots & \vdots & \vdots \\ 0 & 0 & 0 & \ddots & -\frac{1}{C_3}\left(\frac{1}{L_3}+\frac{1}{L_2}\right) & \frac{1}{C_3 L_2} & 0 \\ 0 & 0 & 0 & \ddots & \frac{1}{C_2 L_2} & -\frac{1}{C_2}\left(\frac{1}{L_2}+\frac{1}{L_1}\right) & \frac{1}{C_2 L_1} \\ 0 & 0 & 0 & \cdots & 0 & \frac{1}{C_1 L_1} & \frac{1}{C_1 L_1} \end{bmatrix},$$

and said sub-matrix $A_{22}$ is in a form as an n×n matrix $$A_{22} = \begin{bmatrix} -\frac{R_n}{L_n} & \frac{C_{n-1}}{C_n}\left(\frac{R_{n-1}}{L_{n-1}}-\frac{R_n}{L_n}\right) & \frac{C_{n-2}}{C_n}\left(\frac{R_{n-1}}{L_{n-1}}-\frac{R_n}{L_n}\right) & \cdots & \frac{C_2}{C_n}\left(\frac{R_{n-1}}{L_{n-1}}-\frac{R_n}{L_n}\right) & \frac{C_1}{C_n}\left(\frac{R_{n-1}}{L_{n-1}}-\frac{R_n}{L_n}\right) \\ 0 & -\frac{R_{n-1}}{L_{n-1}} & \frac{C_{n-2}}{C_{n-1}}\left(\frac{R_{n-2}}{L_{n-2}}-\frac{R_{n-1}}{L_{n-1}}\right) & \cdots & \frac{C_2}{C_{n-1}}\left(\frac{R_{n-2}}{L_{n-2}}-\frac{R_{n-1}}{L_{n-1}}\right) & \frac{C_1}{C_{n-1}}\left(\frac{R_{n-2}}{L_{n-2}}-\frac{R_{n-1}}{L_{n-1}}\right) \\ 0 & 0 & -\frac{R_{n-2}}{L_{n-2}} & \cdots & \frac{C_2}{C_{n-2}}\left(\frac{R_{n-3}}{L_{n-3}}-\frac{R_{n-2}}{L_{n-2}}\right) & \frac{C_1}{C_{n-2}}\left(\frac{R_{n-3}}{L_{n-3}}-\frac{R_{n-2}}{L_{n-2}}\right) \\ \vdots & \vdots & \vdots & \ddots & \vdots & \vdots \\ 0 & 0 & 0 & \cdots & -\frac{R_2}{L_2} & \frac{C_1}{C_2}\left(\frac{R_1}{L_1}-\frac{R_2}{L_2}\right) \\ 0 & 0 & 0 & \cdots & 0 & -\frac{R_1}{L_1} \end{bmatrix};$$

(c) setting said sub-matrix $A_{22}$ with one non-zero row entries formulated with the source resistor $R_s$ further, and one non-zero column entries formulated with the load capacitor $C_0$ further, in which one entry formulation further includes the load resistor $R_0$;

whereby the established state space model is suitable to said interconnect or transmission line with the source resistor, the load capacitor and the load resistor.

6. The method of claim 5, wherein
(a) said section index i together with the resistor $R_i$, inductor $L_i$ and capacitor $C_i$ is arranged in a sequence, say upward from the final sink to the source by 1 through n, i=1, . . . ,n;
(b) said state variable vector has its entries of said node voltages in a sequence, say from the node next to the source input terminal to the final sink terminal node, and its entries of said node voltage derivatives in the same sequence;
(c) said sub-matrix $A_{21}$ is in a form as an n×n matrix $$\begin{bmatrix} -\frac{1}{C_n}\left(\frac{1}{L_n}+\frac{1}{L_{n-1}}\right) & \frac{1}{C_n L_{n-1}} & 0 & \cdots & 0 & 0 & \frac{1}{R_0 C_n}\left(\frac{R_{n-1}}{L_{n-1}}-\frac{R_n+R_S}{L_n}\right) \\ \frac{1}{C_{n-1}L_{n-1}} & -\frac{1}{C_{n-1}}\left(\frac{1}{L_{n-1}}+\frac{1}{L_{n-2}}\right) & \frac{1}{C_{n-1}L_{n-2}} & \cdots & 0 & 0 & \frac{1}{R_0 C_{n-1}}\left(\frac{R_{n-2}}{L_{n-2}}-\frac{R_{n-1}}{L_{n-1}}\right) \\ 0 & \frac{1}{C_{n-2}L_{n-2}} & -\frac{1}{C_{n-2}}\left(\frac{1}{L_{n-2}}+\frac{1}{L_{n-3}}\right) & \cdots & 0 & 0 & \frac{1}{R_0 C_{n-2}}\left(\frac{R_{n-3}}{L_{n-3}}-\frac{R_{n-2}}{L_{n-2}}\right) \\ \vdots & \vdots & \vdots & \ddots & \vdots & \vdots & \vdots \\ 0 & 0 & 0 & \cdots & -\frac{1}{C_3}\left(\frac{1}{L_3}+\frac{1}{L_2}\right) & \frac{1}{C_3 L_2} & \frac{1}{R_0 C_3}\left(\frac{R_2}{L_2}-\frac{R_3}{L_3}\right) \\ 0 & 0 & 0 & \cdots & \frac{1}{C_2 L_2} & -\frac{1}{C_2}\left(\frac{1}{L_2}+\frac{1}{L_1}\right) & \frac{1}{C_2 L_1}+\frac{1}{R_0 C_2}\left(\frac{R_1}{L_1}-\frac{R_2}{L_2}\right) \\ 0 & 0 & 0 & \cdots & 0 & \frac{1}{(C_1+C_0)L_1} & -\frac{R_0+R_1}{R_0(C_1+C_0)L_1} \end{bmatrix};$$

(d) said sub-matrix $A_{22}$ is in a form as an n×n matrix $$\begin{bmatrix} -\frac{R_n+R_s}{L_n} & \frac{C_{n-1}}{C_n}\left(\frac{R_{n-1}}{L_{n-1}}-\frac{R_n+R_s}{L_n}\right) & \frac{C_{n-2}}{C_n}\left(\frac{R_{n-1}}{L_{n-1}}-\frac{R_n+R_s}{L_n}\right) & \cdots & \frac{C_2}{C_n}\left(\frac{R_{n-1}}{L_{n-1}}-\frac{R_n+R_s}{L_n}\right) & \frac{C_1+C_0}{C_n}\left(\frac{R_{n-1}}{L_{n-1}}-\frac{R_n+R_s}{L_n}\right) \\ 0 & -\frac{R_{n-1}}{L_{n-1}} & \frac{C_{n-2}}{C_{n-1}}\left(\frac{R_{n-2}}{L_{n-2}}-\frac{R_{n-1}}{L_{n-1}}\right) & \cdots & \frac{C_2}{C_{n-1}}\left(\frac{R_{n-2}}{L_{n-2}}-\frac{R_{n-1}}{L_{n-1}}\right) & \frac{C_1+C_0}{C_{n-1}}\left(\frac{R_{n-2}}{L_{n-2}}-\frac{R_{n-1}}{L_{n-1}}\right) \\ 0 & 0 & -\frac{R_{n-2}}{L_{n-2}} & \cdots & \frac{C_2}{C_{n-2}}\left(\frac{R_{n-3}}{L_{n-3}}-\frac{R_{n-2}}{L_{n-2}}\right) & \frac{C_1+C_0}{C_{n-2}}\left(\frac{R_{n-3}}{L_{n-3}}-\frac{R_{n-2}}{L_{n-2}}\right) \\ \vdots & \vdots & \vdots & \ddots & \vdots & \vdots \\ 0 & 0 & 0 & \cdots & -\frac{R_2}{L_2} & \frac{C_1+C_0}{C_2}\left(\frac{R_1}{L_1}-\frac{R_2}{L_2}\right) \\ 0 & 0 & 0 & \cdots & 0 & -\frac{R_1}{L_1}-\frac{1}{R_0(C_1+C_0)} \end{bmatrix};$$

(e) said input matrix B is in a form as B=[0 . . . 0 $\vdots$ 1($C_n L_n$) 0 . . . 0]$^T$;
(f) said non-zero entry in the 1×2n row of the output matrix C is 1 at its (n+1−k)-th entry from the left for its k-th node voltage output, k∈{1, . . . ,n}, e.g., C=[0 . . . 1 $\vdots$ 0 . . . 0] for an output of the final sink node 1;

whereby the method builds a closed form for the state space model of the interconnect or transmission line with various distributed RLC parameters and various source resistor and load parameters, making a basis for simulation, model reduction, model verification, performance analysis or circuit design with a low computation complexity for the distributed interconnect or transmission line.

7. The method of claim 1, further including the following steps of
(a) establishing a small 2m-th order (m<n) state space model by executing a group of steps of claim 1 where n is replaced by m;
(b) setting a model reduction performance error criterion of the 2m-th order state space model from the original 2n-th state space model;
(c) searching a set of 3m optimal distributed parameters for the resistors, inductors and capacitors in the 2m-th order state space model by minimizing the performance criterion;
(d) building a new 2m-th order state space model by utilizing the searched optimal distributed parameters;

whereby this method provides an optimized 2m-th order reduced state space model for the interconnect or transmission line, that is a guaranteed stable and physical synthesizable reduced order RLC model through this stable numerical method.

8. The method of claim 1, further including the following steps of
(a) building a 2nd order reduced model with a resistor $R_r$, an inductor $L_r$, and a capacitor $C_r$, and establishing its 2nd order state space model with a system matrix $$A_r = \begin{bmatrix} 0 & 1 \\ -\frac{1}{C_r L_r} & -\frac{R_r}{L_r} \end{bmatrix},$$

an input matrix $$B_r = \begin{bmatrix} 0 \\ \frac{1}{C_r L_r} \end{bmatrix},$$

an output matrix C=[1 0], and a direct output scalar D=0;
  (b) setting a model reduction performance error criterion of this 2nd order state space model from the original 2n-th state space model;
  (c) searching a set of optimal parameters for the resistor $R_r$, the inductor $L_r$ and the capacitor $C_r$, by minimizing the performance criterion;
  (d) building a new 2nd order state space model by utilizing the searched optimal parameters as a 2nd order reduced state space model for the RLC interconnect or transmission line.

9. The method of claim 1, wherein the distributed parameters are scaled to facilitate simulation, performance analysis, or circuit design.

10. A software product stored on a computer readable medium when executed by a computer utilizing said method in claim 1.

11. A hardware product utilizing said method in claim 1.

12. A method for establishing a time-domain state space model of an even RLC interconnect or transmission line for simulation, or performance analysis, or model reduction, or circuit design, including the steps of
  (a) setting a model order (an even number) for the state space model, denoted as 2n;
  (b) forming the even RLC interconnect or transmission line as n sections in series from a source input terminal down to a final sink terminal with said source input terminal and n nodes, where n−1 nodes are internal connection nodes, and one end node is the final sink terminal, said n sections have an section index, say i, each section i has same elements comprising a resistor R and an inductor L in series and connected to two nodes of section i, and a capacitor C connected to its downward node i of section i and a ground;
  (c) assigning a set of even distributed resistance, distributed inductance and distributed capacitance for said n sections, as said R, said L, and said C for each section i, and having an output port at one of said nodes with a voltage driven by a source voltage input to the source input terminal;
  (d) taking the voltages of said n nodes and their derivatives as a state variable vector of said time-domain model, the source voltage as an input variable, and the output port voltage as an output variable;
  (e) building a 2n×2n system matrix A with four n×n sub-matrices as $A_{11}$, $A_{12}$, $A_{21}$, and $A_{22}$ as $$A = \begin{bmatrix} A_{11} & A_{12} \\ A_{21} & A_{22} \end{bmatrix},$$

where the sub-matrix $A_{11}$ is set as a 0-matrix, the sub-matrix $A_{12}$ is set as an identity matrix I, the entries of the diagonal line, super-diagonal line and sub-diagonal line of the sub-matrix $A_{21}$ are formulated respectively from the distributed inductance L and capacitance C, the sub-matrix $A_{22}$ is set as a matrix with its non-zero diagonal entries being formulated from the distributed resistance R and inductance L;
  (f) building a 2n×1 input matrix B with a non-zero entry formulated from the distributed inductance L and capacitance C;
  (g) building an output matrix C with an 1×2n row having only one non-zero entry at one of its first n entries for selecting said output port node voltage;
  (h) building a zero direct output matrix D;
  (i) forming the time-domain state space model {A, B, C, D} by said four matrices A, B, C and D;
whereby the state variable vector of the time-domain state space model follows a differential equation called a system equation $\dot{x}(t)=Ax(t)+Bu(t)$, the output variable follows an algebraic equation called an output equation $y(t)=Cx(t)+Du(t)$, where x(t) denotes the state variable vector, u(t) denotes the source voltage, and y(t) denotes an output vector including the output port voltage, said method provides a closed form for establishing the time-domain state space model of the interconnect or transmission line without any calculation of matrix inverse, matrix decomposition and matrix multiplication, thus the method significantly reduces its computation complexity not only for modeling but also for further simulation, model reduction, verification, performance analysis, or circuit design.

13. The method of claim 12, wherein
  (a) said section index i is arranged in a sequence, say upward from the final sink to the source by 1 through n, i=1, . . . ,n;
  (b) said state variable vector has its entries of said node voltages in a sequence, say from the node next to the source input terminal to the final sink terminal node, and its entries of said node voltage derivatives in the same sequence;
  (c) said sub-matrix $A_{21}$ of the system matrix is in a form as an n×n matrix $$A_{21} = \frac{1}{CL} \begin{bmatrix} -2 & 1 & 0 & \cdots & 0 \\ 1 & \ddots & \ddots & \ddots & \vdots \\ 0 & \ddots & \ddots & \ddots & 0 \\ \vdots & \ddots & \ddots & -2 & 1 \\ 0 & \cdots & 0 & 1 & -1 \end{bmatrix};$$

(d) said sub-matrix $A_{22}$ is in a form as an n×n diagonal matrix $$A_{22} = -\frac{R}{L} \cdot I_{n \times n};$$

(f) said input matrix B is in a form as B=[0 . . . 0:1/(CL) 0 . . . $0]^T$;
  (e) said non-zero entry in the 1×2n row of the output matrix C is 1 at its (n+1−k)-th entry from the left for its k-th node voltage output, $1 \leq k \leq n$, e.g., C=[0 . . . 0 1:0 . . . 0] for an output of the final sink node 1;

whereby the method has a computation complexity O(1), making a basis for further simulation, model reduction, verification, performance analysis, optimization, or circuit design.

14. The method of claim 12, further including the following steps of
   (a) arranging the section index and node index i in a sequence upward from the final sink to the source by 1 through n, i=1, . . . ,n;
   (b) arranging the node voltage entries of said state variable vector in a sequence from the node next to the source input terminal to the final sink terminal node, and its entries of said node voltage derivatives in the same sequence;
   (c) forming a source resistor with a resistance $R_s$ connected to a source signal and said source input terminal, and a load capacitor with a capacitance $C_0$ and a load resistor with a resistance $R_0$ in parallel connected to said final sink terminal and the ground;
   (d) further setting said sub-matrix $A_{21}$ in a form as an n×n matrix $$A_{21} = \frac{1}{CL}\begin{bmatrix} -2 & 1 & 0 & \cdots & 0 & -\frac{R_s}{R_0} \\ 1 & \ddots & \ddots & \ddots & \ddots & 0 \\ 0 & \ddots & \ddots & \ddots & \ddots & \vdots \\ \vdots & \ddots & \ddots & \ddots & 1 & 0 \\ \vdots & \ddots & \ddots & 1 & -2 & 1 \\ 0 & \cdots & \cdots & 0 & \frac{1}{1+C_0/C} & -\frac{1+R/R_0}{1+C_0/C} \end{bmatrix} \text{ when } n>2 \text{ or}$$

$$A_{21} = \frac{1}{CL}\begin{bmatrix} -2 & 1-\frac{R_s}{R_0} \\ \frac{1}{1+C_0/C} & -\frac{R+R_0}{R_0(1+C_0/C)} \end{bmatrix} \text{ when } n=2;$$

(e) further setting said sub-matrix $A_{22}$ as $$A_{22} = \begin{bmatrix} -\frac{R+R_s}{L} & -\frac{R_s}{L} & -\frac{R_s}{L} & \cdots & -\frac{R_s}{L} & -\frac{R_s(C+C_0)}{LC} \\ 0 & -\frac{R}{L} & 0 & \cdots & 0 & 0 \\ 0 & 0 & -\frac{R}{L} & \ddots & 0 & 0 \\ \vdots & \ddots & \ddots & \ddots & \ddots & \vdots \\ 0 & \ddots & \ddots & \ddots & -\frac{R}{L} & 0 \\ 0 & 0 & 0 & \cdots & 0 & -\frac{R}{L}-\frac{1}{R_0(C+C_0)} \end{bmatrix}$$

when $n>2$ or $$A_{22} = \begin{bmatrix} -\frac{R+R_s}{L} & -\frac{R_s(1+C_0/C)}{L} \\ 0 & -\frac{R}{L}-\frac{1}{R_0(C_1+C_0)} \end{bmatrix} \text{ when } n=2;$$

(f) said input matrix B is in a form as $B=[0 \ldots 0\ 1/(CL)\ 0 \ldots 0]^T$;
   (g) said non-zero entry in the 1×2n row of the output matrix C is 1 at its (n+1−k)-th entry from the left for its k-th node voltage output, $1 \leq k \leq n$, e.g., $C=[0 \ldots 0\ 1\ 0 \ldots 0]$ for an output of the final sink node 1;

whereby the method has a computation complexity O(1), making a basis for further simulation, model reduction, verification, performance analysis, optimization, or circuit design.

15. The method of claim 14, further including the following steps of
   (a) establishing a small 2m-th order (m<n) state space model by executing a group of steps of claim 14 where n is replaced by m;
   (b) setting a model reduction performance error criterion of the 2m-th order state space model from the original 2n-th state space model;
   (c) searching a set of 3 optimal distributed parameters for the even distributed resistance, inductance and capacitance in the 2m-th order state space model by minimizing the performance criterion;
   (d) building a new 2m-th state space model by utilizing the searched 3 optimal parameters as a 2m-th order reduced state space model;
   whereby this method provides an optimized 2m-th order reduced state space model for the even RLC interconnect or transmission line with the source resistor, the load resistor and capacitor, that is a guaranteed stable and physical synthesizable reduced order RLC model through this stable numerical method.

16. The method of claim 12, further including the following steps of
   (a) establishing a small 2m-th order (m<n) state space model by executing a group of steps of claim 12 where n is replaced by m;
   (b) setting a model reduction performance error criterion of the 2m-th order state space model from the original 2n-th state space model;
   (c) searching a set of 3 optimal distributed parameters for the even distributed resistance, inductance and capacitance in the 2m-th order state space model by minimizing the performance criterion;
   (d) building a new 2m-th state space model by utilizing the searched 3 optimal parameters as a 2m-th order reduced state space model;
   whereby this method provides an optimized 2m-th order reduced state space model for the even RLC interconnect or transmission line, that is a guaranteed stable and physical synthesizable reduced order RLC model through this stable numerical method.

17. The method of claim 12, wherein the even distributed parameters are scaled to facilitate simulation, performance analysis, or circuit design.

18. A software product stored on a compuuter readable medium when executed by a computer utilizing said method in claim 12.

19. A hardware product utilizing said method in claim 12.

20. A recursive method for establishing a frequency-domain transfer function model T(s) of an RLC interconnect or transmission line including the steps of
   (a) setting a model order (an even number) for the transfer function model, denoted as 2n;
   (b) forming the RLC interconnect or transmission line as n sections in series from a source input terminal down to a final sink terminal with said source input terminal and n nodes, where n−1 nodes are conjunction nodes between neighbor sections, and one end node is the final sink terminal, said n sections have an section index, say i, and each section i has elements comprising a resistor $R_i$, an inductor $L_i$ and a capacitor $C_i$, its resistor $R_i$ and inductor $L_i$ are in series and connect to two nodes of section i, its capacitor $C_i$ connects to its downward node i of section i and a ground;

(c) arranging the index i of said section i together with its resistor $R_i$, inductor $L_i$ and capacitor $C_i$ in a sequence upward from the final sink to the source by 1 through n, i=1, . . . ,n;

(d) assigning a set of distributed resistances, inductances and capacitances for said n sections, as said $R_i$, $L_i$, and $C_i$ for each section i respectively;

(e) taking a source voltage signal input to the source input terminal as an input variable of the transfer function model, and an output port voltage at the final sink terminal as an output variable of the transfer function model;

(f) setting the numerator of said transfer function to be 1;

(g) setting initial values (coefficients) to a first recursive s-polynomial and a second recursive s-polynomial respectively based on the section 1;

(h) executing n-1 recursive cycles with a recursive cycle index, say j, wherein
 (1) if n=1, stop the recursive cycle; otherwise
 (2) if n>1, do n-1 recursive cycles, say for j=2 . . . ,n, where each cycle j first updates the first recursive polynomial by a first recursive formulation related to the section j and the current values of two recursive s-polynomials, then updates the second recursive polynomial by a second recursive formulation related to the section j and the current values of two recursive s-polynomials, in which the first recursive s-polynomial has just been updated in this cycle;

(i) setting the denominator of said transfer function to be the second recursive s-polynomial value after completing said n-1 recursive cycles;

whereby the frequency domain transfer function model of the RLC interconnect or transmission line has its recursive method, making a basis for simulation, model reduction, verification, performance analysis, or circuit design.

21. The method of claim 20, wherein
(a) said initial value of the first recursive polynomial is $C_1s$ and said initial value of the second recursive polynomial is $s(L_1s+R_1)C_1+1$;
(b) said first recursive formulation at the j-th cycle for updating the first recursive polynomial is a sum of the first recursive polynomial and a product of the second recursive polynomial and the capacitor value $C_j$ and s-variable, i.e., $\Delta_j(s)=sC_jD_{j-1}(s)+\Delta_{j-1}(s)$, where $\Delta_{j-1}(s)$ and $D_{j-1}(s)$ respectively denote the first and the second recursive polynomials which are completed in cycle j-1;
(c) said second recursive formulation at the j-th cycle for updating the second recursive polynomial is a sum of the current value of the second recursive polynomial, i.e., $D_{j-1}(s)$, and a product of the current first recursive polynomial $\Delta_j(s)$ and a form of $L_js+R_j$ from the inductor $L_j$ and the resistor $R_j$, i.e., $D_j(s)=(L_js+R_j)\Delta_j+D_{j-1}(s)$.

22. The method of claim 21, wherein
(a) all said resistances $R_i$, inductances $L_i$, and capacitances $C_i$, i=1, . . . ,n, are evenly equal to a distributed resistor value R, a distributed inductor value L, and a distributed capacitor value C, respectively;
(b) said initial value of the first recursive polynomial reduces to $\Delta_1(s)=Cs$ and said initial value of the second recursive polynomial reduces to $D_1(s)=s(Ls+R)C+1$;

(c) said first recursive formulation at the j-th cycle reduces to $\Delta_j(s)=sCD_{j-1}(s)+\Delta_{j-1}(s)$;
(d) said second recursive formulation at the j-th cycle reduces to $D_j(s)=(Ls+R)\Delta_j+D_{j-1}(s)$;
whereby said transfer function model is easily built by said two recursive formulations for an evenly distributed interconnect or transmission line, with accuracy and efficiency, making a basis for simulation, performance analysis, model reduction, optimization or circuit design.

23. The method of claim 22, further including the following steps of
(a) establishing a small 2m-th order (m<n) transfer function model by executing a group of the steps of claim 22 where n is replaced by m;
(b) setting a model reduction performance error criterion of the 2m-th order transfer function model from the 2n-th transfer function model;
(c) searching a set of 3 optimal distributed parameters of the even resistor, inductor and capacitor in the 2m-th transfer function model by minimizing the performance criterion;
(d) building a new 2m-th transfer function model by utilizing the searched 3 optimal distributed parameters as a 2m-th order reduced transfer function model for the evenly distributed RLC interconnect or transmission line;
whereby this method provides an optimized 2m-th order reduced transfer function model for the even RLC interconnect or transmission line, that is a guaranteed stable and physical synthesizable reduced order RLC model through a stable numerical method for further simulation, performance analysis, or circuit design.

24. The method of claim 20, further including the following steps of
(a) forming a source resistor with a resistance $R_s$ connected to a source signal and said source input terminal, and a load capacitor with a capacitance $C_0$ and a load resistor with a resistance $R_0$ in parallel connected to said final sink terminal and the ground;
(b) updating said initial value of the first recursive polynomial as $$\Delta_1(s) = (C_1 + C_0)s + \frac{1}{R_0}$$

and said initial value of the second recursive polynomial as $$D_1(s) = s(L_1s + R_1)(C_1 + C_0) + 1 + \frac{L_1s + R_1}{R_0}$$

in the step (g) of claim 20;
(c) updating said second recursive formulation at the last cycle, i.e., j=n, by the source resistance $R_s$;
whereby the established transfer function model is suitable explicitly to said interconnect or transmission line with the source resistor, the load capacitor and the load resistor.

25. The method of claim 24, wherein
(a) all said resistances $R_i$, inductances $L_i$, and capacitances $C_i$, i=1, . . . ,n, are evenly equal to a distributed resistor value R, a distributed inductor value L, and a distributed capacitor value C, respectively;

(b) said initial value of the first recursive polynomial reduces to $$\Delta_1(s) = (C + C_0)s + \frac{1}{R_0}$$

and said initial value of the second recursive polynomial reduces to $$D_1(s) = s(Ls + R)(C + C_0) + 1 + \frac{Ls + R}{R_0};$$

(c) said first recursive formulation at the j-th cycle (j=2, ... ,n) reduces to $\Delta_j(s)=sCD_{j-1}(s)+\Delta_{j-1}(s)$;
(d) said second recursive formulation at the j-th cycle (j=2, ... ,n−1) reduces to $D_j(s)=(Ls+R)\Delta_j+D_{j-1}(s)$;
(e) said second recursive formulation at the last cycle, i.e., j=n, reduces to $D_n(s)=(Ls+R+R_s)\Delta_n+D_{n-1}(s)$;

whereby said method efficiently establishes the transfer function model by said recursive method for an evenly distributed interconnect or transmission line with the source and load parts, making a basis for simulation, performance analysis, model reduction, optimization or circuit design.

26. The method of claim 24, further including the following steps of
(a) establishing a small 2m-th order (m<n) transfer function model by executing a group of steps of claim 24 where n is replaced by m;
(b) setting a model reduction performance error criterion of the 2n-th order transfer function model from the original 2n-th transfer function model;
(c) searching a set of 3m optimal distributed parameters for the resistors, inductors and capacitors in the 2m-th order transfer function model by minimizing the performance criterion;
(d) building a new 2m-th order transfer function model by utilizing the searched optimal distributed parameters as a 2m-th order reduced transfer function model;
whereby this method provides an optimized 2m-th order reduced transfer function model for the RLC interconnect or transmission line with the source and load parts, that is a guaranteed stable and physical synthesizable reduced order RLC model through this stable numerical method.

27. The method of claim 20, further including the following steps of
(a) establishing a small 2m-th order (m<n) transfer function model by executing a group of steps of claim 20 where n is replaced by m;
(b) setting a model reduction performance error criterion of the 2m-th order transfer function model from the original 2n-th transfer function model;
(c) searching a set of 3m optimal distributed parameters for the resistors, inductors and capacitors in the 2m-th order transfer function model by minimizing the performance criterion;
(d) building a new 2m-th order transfer function model by utilizing the searched optimal distributed parameters as a 2m-th order reduced transfer function model;
whereby this method provides an optimized 2m-th order reduced transfer function model for the RLC interconnect or transmission line, that is a guaranteed stable and physical synthesizable reduced order RLC model through this stable numerical method, and it can be used for further simulation, circuit design or performance analysis.

28. The method of claim 20, wherein the distributed parameters are scaled to facilitate simulation, performance analysis, or circuit design.

29. A software product stored on a computer readable medium when executed by a computer utilizing said method in claim 20.

30. A hardware product utilizing said method in claim 20.

* * * * *

UNITED STATES PATENT AND TRADEMARK OFFICE
CERTIFICATE OF CORRECTION

PATENT NO. : 7,251,791 B2
APPLICATION NO. : 11/037636
DATED : July 31, 2007
INVENTOR(S) : Sheng-Guo Wang It is certified that error appears in the above-identified patent and that said Letters Patent is hereby corrected as shown below:

1. Column 2, line 53, ":" should read --.--.
2. Column 6, eq. (8), at the last col. and the 3rd row of the matrix, " $\frac{R_{n-2}}{L_{n-3}}$ " should read -- $\frac{R_{n-3}}{L_{n-3}}$ --.

3. Column 6, eq. (8), at the 4th col. and the 4th row of the matrix, ".·" should read --˙.--.

4. Column 6, eq. (8), at the last col. and the 5th row of the matrix, " $\frac{1}{R_0 C_2}$ " should read -- $\frac{1}{R_0 C_3}$ --.

5. Column 7, eq. (9), at the 4th col. and 4th row of the matrix, ".·" should read --˙.--.
6. Column 9, line 8, eq. (27), "$(L_n s + R_n + R_s)$" should read --$(L_n s + R_n + R_s)\Delta_n$--.
7. Column 9, line 9, eq. (27), "$\Delta_n + D_{n-1}(s)$" should read --$+D_{n-1}(s)$--.
8. Column 11, eq. (33), ".·"should read --˙.--.
9. Column 11, eq. (34), ".·" should read --˙.--.
10. Column 12, line 7, "$L_n$." should read --$L_{n-1}$--.
11. Column 12, line 27, eq (36), "$i =1,\cdots,$" should read --$i = 1,\cdots, n - 1$,--.
12. Column 13, line 4, "n - 1," should be deleted.
13. Column 14, eq. (44), ".·" should read --˙.--.
14. Column 15, eq. (45), at the 5th column and 3rd row of the matrix, " $\frac{R_{n-1}}{L_{n-2}}$ " should read -- $\frac{R_{n-2}}{L_{n-2}}$ --.

15. Column 15, eq. (45), ".·" should read --˙.--.
16. Column 16, eq. (56), ".·" should read --˙.--.
17. Column 17, eq. (57), ".·" should read --˙.--.
18. Column 19, eq. (73) and eq. (74), all ".·" should read --˙.--.
19. Column 23, line 23, eq. (109), "$(L_s + R)$" should read --$(Ls + R)$--.
20. Column 24, line 53, eq. (121), ".·" should read --˙.--, and "= =" should read -- = --.
21. Column 25, eq. (129) and eq. (130), all ".·" should read --˙.--.

22. Column 25, line 50, eq. (131), " $\frac{1}{r^2 CL}$ " should read -- $\frac{1}{r^2 CL} \cdot [00\,...010\,..\,0]^T$--.

23. Column 25, line 51, eq. (131), "$[0\,0...010...0]^T$" should be deleted.
24. Column 26, line 27, eq. (135), "$(1 + C_0 +/nC)$" should read --$(1 + C_0/nC)$--.
25. Column 27, line 62, ".·" should read --˙.--.
26. Column 29, in matrices $A_{21}$ and $A_{22}$, all ".·" should read --˙.--.

UNITED STATES PATENT AND TRADEMARK OFFICE
CERTIFICATE OF CORRECTION

PATENT NO. : 7,251,791 B2
APPLICATION NO. : 11/037636
DATED : July 31, 2007
INVENTOR(S) : Sheng-Guo Wang It is certified that error appears in the above-identified patent and that said Letters Patent is hereby corrected as shown below:

27. Column 31, claim 3 (c), in matrix $A_{21}$, all ".·˙" should read --˙·.--.

28. Column 31, claim 3 (c), in the bottom right corner of matrix $A_{21}$, " $\frac{1}{C_1 L_1}$ " should read -- $-\frac{1}{C_1 L_1}$ --.

29. Column 31, claim 3 (c), in matrix $A_{22}$, ".·˙" should read --˙·.--.
30. Column 33, claim 6 (c), in matrix $A_{21}$, ".·˙" should read --˙·.--.
31. Column 33, claim 6 (d), in matrix $A_{22}$, ".·˙" should read --˙·.--.
32. Column 33, line 57, claim 6 (e), "1 $(C_n L_n)$" should read --1/$(C_n L_n)$--.
33. Column 36, lines 47-49, claim 13 (c), in matrix $A_{21}$, all ".·˙" should read --˙·.--.
34. Column 36, line 62, claim 13 (f), "0 ... $0^T$" should read --0 ... $0]^T$--.
35. Column 37, lines 28-32, claim 14 (d), in matrix $A_{21}$, all ".·˙" should read --˙·.--.
36. Column 37, lines 49-52, claim 14 (e), in matrix $A_{22}$, all ".·˙" should read --˙·.--.
37. Column 41, line 34, claim 26 (b), "of the 2n-th" should read --of the 2m-th--.

Signed and Sealed this

Eighth Day of January, 2008

JON W. DUDAS
*Director of the United States Patent and Trademark Office*